US008384576B2

(12) United States Patent
Ishii et al.

(10) Patent No.: US 8,384,576 B2
(45) Date of Patent: Feb. 26, 2013

(54) OUTPUT CIRCUIT, AND DATA DRIVER AND DISPLAY DEVICES USING THE SAME

(75) Inventors: Junichiro Ishii, Kanagawa (JP); Hiroshi Tsuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/447,546

(22) Filed: Apr. 16, 2012

(65) Prior Publication Data

US 2012/0200441 A1 Aug. 9, 2012

Related U.S. Application Data

(62) Division of application No. 11/979,714, filed on Nov. 7, 2007, now Pat. No. 8,217,883.

(30) Foreign Application Priority Data

Nov. 8, 2006 (JP) ................................ 2006-302956

(51) Int. Cl.
*H03M 1/66* (2006.01)

(52) U.S. Cl. ......................................... 341/144; 345/89

(58) Field of Classification Search .................. 341/144; 345/89, 98

See application file for complete search history.

(56) References Cited

U.S. PATENT DOCUMENTS

| | | | | |
|---|---|---|---|---|
| 5,731,774 | A | 3/1998 | Fujii et al. | |
| 6,246,351 | B1 | 6/2001 | Yilmaz | |
| 6,331,846 | B1 | 12/2001 | Nakao | |
| 6,441,763 | B1 | 8/2002 | Nakao | |
| 6,707,442 | B2 | 3/2004 | Watanabe | |
| 7,369,075 | B2 * | 5/2008 | Ishii et al. | 341/144 |
| 2006/0214900 | A1 | 9/2006 | Tsuchi et al. | |
| 2008/0143658 | A1 | 6/2008 | Ishii et al. | |

FOREIGN PATENT DOCUMENTS

| | | |
|---|---|---|
| JP | 9-64746 | 3/1997 |
| JP | 11-305735 | 11/1999 |
| JP | 2001-343948 | 12/2001 |
| JP | 2002-43944 | 2/2002 |
| JP | 2002-62852 | 2/2002 |
| JP | 2006-197532 | 7/2006 |

OTHER PUBLICATIONS

Japanese Office Action dated Oct. 9, 2008 (with a partial English translation).

United States Office Action dated Dec. 11, 2012 in U.S. Appl. No. 13/485,253.

* cited by examiner

*Primary Examiner* — Kevin M Nguyen
*Assistant Examiner* — Sepideh Ghafari
(74) *Attorney, Agent, or Firm* — McGinn IP Law Group, PLLC

(57) ABSTRACT

An output circuit includes a connection switch and an operation unit. The connection switch receives first and second voltages from first and second terminals, respectively, selects and outputs the first voltage or the second voltage for first to third intermediate terminals, including selection of the same voltage and switches assignment of the first and second voltages to the first to third intermediate terminals responsive to a connection switching signal. The operation unit receives the voltages assigned to the first to third intermediate terminals and outputs to an output terminal a voltage obtained by performing a predetermined operation on the voltages.

9 Claims, 28 Drawing Sheets

FIG. 3

| GRAY SCALE | BIT DATA | | | | | | OUTPUTS OF SELECTION CIRCUIT | |
|---|---|---|---|---|---|---|---|---|
| | D0 | D1 | D2 | D3 | D4 | D5 | V1 | V2 |
| 0 | 0 | 0 | 0 | 0 | 0 | 0 | VG00 | VG00 |
| 1 | 1 | 0 | 0 | 0 | 0 | 0 | VG03 | VG00 |
| 2 | 0 | 1 | 0 | 0 | 0 | 0 | VG00 | VG03 |
| 3 | 1 | 1 | 0 | 0 | 0 | 0 | VG03 | VG03 |
| 4 | 0 | 0 | 1 | 0 | 0 | 0 | VG12 | VG00 |
| 5 | 1 | 0 | 1 | 0 | 0 | 0 | VG15 | VG00 |
| 6 | 0 | 1 | 1 | 0 | 0 | 0 | VG12 | VG03 |
| 7 | 1 | 1 | 1 | 0 | 0 | 0 | VG15 | VG03 |
| 8 | 0 | 0 | 0 | 1 | 0 | 0 | VG00 | VG12 |
| 9 | 1 | 0 | 0 | 1 | 0 | 0 | VG03 | VG12 |
| 10 | 0 | 1 | 0 | 1 | 0 | 0 | VG00 | VG15 |
| 11 | 1 | 1 | 0 | 1 | 0 | 0 | VG03 | VG15 |
| 12 | 0 | 0 | 1 | 1 | 0 | 0 | VG12 | VG12 |
| 13 | 1 | 0 | 1 | 1 | 0 | 0 | VG15 | VG12 |
| 14 | 0 | 1 | 1 | 1 | 0 | 0 | VG12 | VG15 |
| 15 | 1 | 1 | 1 | 1 | 0 | 0 | VG15 | VG15 |
| 16 | 0 | 0 | 0 | 0 | 1 | 0 | VG48 | VG00 |
| 17 | 1 | 0 | 0 | 0 | 1 | 0 | VG51 | VG00 |
| 18 | 0 | 1 | 0 | 0 | 1 | 0 | VG48 | VG03 |
| 19 | 1 | 1 | 0 | 0 | 1 | 0 | VG51 | VG03 |
| 20 | 0 | 0 | 1 | 0 | 1 | 0 | VG60 | VG00 |
| 21 | 1 | 0 | 1 | 0 | 1 | 0 | VG63 | VG00 |
| 22 | 0 | 1 | 1 | 0 | 1 | 0 | VG60 | VG03 |
| 23 | 1 | 1 | 1 | 0 | 1 | 0 | VG63 | VG03 |
| 24 | 0 | 0 | 0 | 1 | 1 | 0 | VG48 | VG12 |
| 25 | 1 | 0 | 0 | 1 | 1 | 0 | VG51 | VG12 |
| 26 | 0 | 1 | 0 | 1 | 1 | 0 | VG48 | VG15 |
| 27 | 1 | 1 | 0 | 1 | 1 | 0 | VG51 | VG15 |
| 28 | 0 | 0 | 1 | 1 | 1 | 0 | VG60 | VG12 |
| 29 | 1 | 0 | 1 | 1 | 1 | 0 | VG63 | VG12 |
| 30 | 0 | 1 | 1 | 1 | 1 | 0 | VG60 | VG15 |
| 31 | 1 | 1 | 1 | 1 | 1 | 0 | VG63 | VG15 |

| GRAY SCALE | BIT DATA | | | | | | OUTPUTS OF SELECTION CIRCUIT | |
|---|---|---|---|---|---|---|---|---|
| | D0 | D1 | D2 | D3 | D4 | D5 | V1 | V2 |
| 32 | 0 | 0 | 0 | 0 | 0 | 1 | VG00 | VG48 |
| 33 | 1 | 0 | 0 | 0 | 0 | 1 | VG03 | VG48 |
| 34 | 0 | 1 | 0 | 0 | 0 | 1 | VG00 | VG51 |
| 35 | 1 | 1 | 0 | 0 | 0 | 1 | VG03 | VG51 |
| 36 | 0 | 0 | 1 | 0 | 0 | 1 | VG12 | VG48 |
| 37 | 1 | 0 | 1 | 0 | 0 | 1 | VG15 | VG48 |
| 38 | 0 | 1 | 1 | 0 | 0 | 1 | VG12 | VG51 |
| 39 | 1 | 1 | 1 | 0 | 0 | 1 | VG15 | VG51 |
| 40 | 0 | 0 | 0 | 1 | 0 | 1 | VG00 | VG60 |
| 41 | 1 | 0 | 0 | 1 | 0 | 1 | VG03 | VG60 |
| 42 | 0 | 1 | 0 | 1 | 0 | 1 | VG00 | VG63 |
| 43 | 1 | 1 | 0 | 1 | 0 | 1 | VG03 | VG63 |
| 44 | 0 | 0 | 1 | 1 | 0 | 1 | VG12 | VG60 |
| 45 | 1 | 0 | 1 | 1 | 0 | 1 | VG15 | VG60 |
| 46 | 0 | 1 | 1 | 1 | 0 | 1 | VG12 | VG63 |
| 47 | 1 | 1 | 1 | 1 | 0 | 1 | VG15 | VG63 |
| 48 | 0 | 0 | 0 | 0 | 1 | 1 | VG48 | VG48 |
| 49 | 1 | 0 | 0 | 0 | 1 | 1 | VG51 | VG48 |
| 50 | 0 | 1 | 0 | 0 | 1 | 1 | VG48 | VG51 |
| 51 | 1 | 1 | 0 | 0 | 1 | 1 | VG51 | VG51 |
| 52 | 0 | 0 | 1 | 0 | 1 | 1 | VG60 | VG48 |
| 53 | 1 | 0 | 1 | 0 | 1 | 1 | VG63 | VG48 |
| 54 | 0 | 1 | 1 | 0 | 1 | 1 | VG60 | VG51 |
| 55 | 1 | 1 | 1 | 0 | 1 | 1 | VG63 | VG51 |
| 56 | 0 | 0 | 0 | 1 | 1 | 1 | VG48 | VG60 |
| 57 | 1 | 0 | 0 | 1 | 1 | 1 | VG51 | VG60 |
| 58 | 0 | 1 | 0 | 1 | 1 | 1 | VG48 | VG63 |
| 59 | 1 | 1 | 0 | 1 | 1 | 1 | VG51 | VG63 |
| 60 | 0 | 0 | 1 | 1 | 1 | 1 | VG60 | VG60 |
| 61 | 1 | 0 | 1 | 1 | 1 | 1 | VG63 | VG60 |
| 62 | 0 | 1 | 1 | 1 | 1 | 1 | VG60 | VG63 |
| 63 | 1 | 1 | 1 | 1 | 1 | 1 | VG63 | VG63 |

<NO CONNECTION SWITCHING >

<CONNECTION SWITCHING OF THE PRESENT INVENTION >

<CONVENTIONAL CONNECTION SWITCHING (COMPARATIVE EXAMPLE) >

<NO CONNECTION SWITCHING >

<CONNECTION SWITCHING OF THE PRESENT INVENTION >

<CONVENTIONAL CONNECTION SWITCHING (COMPARATIVE EXAMPLE) >

FIG. 13

| GRAY SCALE | BIT DATA | | | | | | OUTPUTS OF SELECTION CIRCUIT | | |
|---|---|---|---|---|---|---|---|---|---|
| | D0 | D1 | D2 | D3 | D4 | D5 | V1 | V2 | V3 |
| 0 | 0 | 0 | 0 | 0 | 0 | 0 | VG00 | VG00 | VG00 |
| 1 | 1 | 0 | 0 | 0 | 0 | 0 | VG07 | VG00 | VG00 |
| 2 | 0 | 1 | 0 | 0 | 0 | 0 | VG00 | VG07 | VG00 |
| 3 | 1 | 1 | 0 | 0 | 0 | 0 | VG07 | VG07 | VG00 |
| 4 | 0 | 0 | 1 | 0 | 0 | 0 | VG00 | VG00 | VG07 |
| 5 | 1 | 0 | 1 | 0 | 0 | 0 | VG07 | VG00 | VG07 |
| 6 | 0 | 1 | 1 | 0 | 0 | 0 | VG00 | VG07 | VG07 |
| 7 | 1 | 1 | 1 | 0 | 0 | 0 | VG07 | VG07 | VG07 |
| 8 | 0 | 0 | 0 | 1 | 0 | 0 | VG56 | VG00 | VG00 |
| 9 | 1 | 0 | 0 | 1 | 0 | 0 | VG63 | VG00 | VG00 |
| 10 | 0 | 1 | 0 | 1 | 0 | 0 | VG56 | VG07 | VG00 |
| 11 | 1 | 1 | 0 | 1 | 0 | 0 | VG63 | VG07 | VG00 |
| 12 | 0 | 0 | 1 | 1 | 0 | 0 | VG56 | VG00 | VG07 |
| 13 | 1 | 0 | 1 | 1 | 0 | 0 | VG63 | VG00 | VG07 |
| 14 | 0 | 1 | 1 | 1 | 0 | 0 | VG56 | VG07 | VG07 |
| 15 | 1 | 1 | 1 | 1 | 0 | 0 | VG63 | VG07 | VG07 |
| 16 | 0 | 0 | 0 | 0 | 1 | 0 | VG00 | VG56 | VG00 |
| 17 | 1 | 0 | 0 | 0 | 1 | 0 | VG07 | VG56 | VG00 |
| 18 | 0 | 1 | 0 | 0 | 1 | 0 | VG00 | VG63 | VG00 |
| 19 | 1 | 1 | 0 | 0 | 1 | 0 | VG07 | VG63 | VG00 |
| 20 | 0 | 0 | 1 | 0 | 1 | 0 | VG00 | VG56 | VG07 |
| 21 | 1 | 0 | 1 | 0 | 1 | 0 | VG07 | VG56 | VG07 |
| 22 | 0 | 1 | 1 | 0 | 1 | 0 | VG00 | VG63 | VG07 |
| 23 | 1 | 1 | 1 | 0 | 1 | 0 | VG07 | VG63 | VG07 |
| 24 | 0 | 0 | 0 | 1 | 1 | 0 | VG56 | VG56 | VG00 |
| 25 | 1 | 0 | 0 | 1 | 1 | 0 | VG63 | VG56 | VG00 |
| 26 | 0 | 1 | 0 | 1 | 1 | 0 | VG56 | VG63 | VG00 |
| 27 | 1 | 1 | 0 | 1 | 1 | 0 | VG63 | VG63 | VG00 |
| 28 | 0 | 0 | 1 | 1 | 1 | 0 | VG56 | VG56 | VG07 |
| 29 | 1 | 0 | 1 | 1 | 1 | 0 | VG63 | VG56 | VG07 |
| 30 | 0 | 1 | 1 | 1 | 1 | 0 | VG56 | VG63 | VG07 |
| 31 | 1 | 1 | 1 | 1 | 1 | 0 | VG63 | VG63 | VG07 |

| GRAY SCALE | BIT DATA | | | | | | OUTPUTS OF SELECTION CIRCUIT | | |
|---|---|---|---|---|---|---|---|---|---|
| | D0 | D1 | D2 | D3 | D4 | D5 | V1 | V2 | V3 |
| 32 | 0 | 0 | 0 | 0 | 0 | 1 | VG00 | VG00 | VG56 |
| 33 | 1 | 0 | 0 | 0 | 0 | 1 | VG07 | VG00 | VG56 |
| 34 | 0 | 1 | 0 | 0 | 0 | 1 | VG00 | VG07 | VG56 |
| 35 | 1 | 1 | 0 | 0 | 0 | 1 | VG07 | VG07 | VG56 |
| 36 | 0 | 0 | 1 | 0 | 0 | 1 | VG00 | VG00 | VG63 |
| 37 | 1 | 0 | 1 | 0 | 0 | 1 | VG07 | VG00 | VG63 |
| 38 | 0 | 1 | 1 | 0 | 0 | 1 | VG00 | VG07 | VG63 |
| 39 | 1 | 1 | 1 | 0 | 0 | 1 | VG07 | VG07 | VG63 |
| 40 | 0 | 0 | 0 | 1 | 0 | 1 | VG56 | VG00 | VG56 |
| 41 | 1 | 0 | 0 | 1 | 0 | 1 | VG63 | VG00 | VG56 |
| 42 | 0 | 1 | 0 | 1 | 0 | 1 | VG56 | VG07 | VG56 |
| 43 | 1 | 1 | 0 | 1 | 0 | 1 | VG63 | VG07 | VG56 |
| 44 | 0 | 0 | 1 | 1 | 0 | 1 | VG56 | VG00 | VG63 |
| 45 | 1 | 0 | 1 | 1 | 0 | 1 | VG63 | VG00 | VG63 |
| 46 | 0 | 1 | 1 | 1 | 0 | 1 | VG56 | VG07 | VG63 |
| 47 | 1 | 1 | 1 | 1 | 0 | 1 | VG63 | VG07 | VG63 |
| 48 | 0 | 0 | 0 | 0 | 1 | 1 | VG00 | VG56 | VG56 |
| 49 | 1 | 0 | 0 | 0 | 1 | 1 | VG07 | VG56 | VG56 |
| 50 | 0 | 1 | 0 | 0 | 1 | 1 | VG00 | VG63 | VG56 |
| 51 | 1 | 1 | 0 | 0 | 1 | 1 | VG07 | VG63 | VG56 |
| 52 | 0 | 0 | 1 | 0 | 1 | 1 | VG00 | VG56 | VG63 |
| 53 | 1 | 0 | 1 | 0 | 1 | 1 | VG07 | VG56 | VG63 |
| 54 | 0 | 1 | 1 | 0 | 1 | 1 | VG00 | VG63 | VG63 |
| 55 | 1 | 1 | 1 | 0 | 1 | 1 | VG07 | VG63 | VG63 |
| 56 | 0 | 0 | 0 | 1 | 1 | 1 | VG56 | VG56 | VG56 |
| 57 | 1 | 0 | 0 | 1 | 1 | 1 | VG63 | VG56 | VG56 |
| 58 | 0 | 1 | 0 | 1 | 1 | 1 | VG56 | VG63 | VG56 |
| 59 | 1 | 1 | 0 | 1 | 1 | 1 | VG63 | VG63 | VG56 |
| 60 | 0 | 0 | 1 | 1 | 1 | 1 | VG56 | VG56 | VG63 |
| 61 | 1 | 0 | 1 | 1 | 1 | 1 | VG63 | VG56 | VG63 |
| 62 | 0 | 1 | 1 | 1 | 1 | 1 | VG56 | VG63 | VG63 |
| 63 | 1 | 1 | 1 | 1 | 1 | 1 | VG63 | VG63 | VG63 |

<NO CONNECTION SWITCHING >

<CONNECTION SWITCHING OF THE PRESENT INVENTION >

<CONVENTIONAL CONNECTION SWITCHING (COMPARATIVE EXAMPLE) >

<NO CONNECTION SWITCHING>

<CONNECTION SWITCHING OF THE PRESENT INVENTION>

<CONVENTIONAL CONNECTION SWITCHING (COMPARATIVE EXAMPLE)>

OUTPUT CIRCUIT, AND DATA DRIVER AND DISPLAY DEVICES USING THE SAME

REFERENCE TO RELATED APPLICATION

This application is a Divisional Application of U.S. patent application Ser. No. 11/979,714, filed on Nov. 7, 2007, now U.S. Pat. No. 8,217,883.

This application is based upon and claims the benefit of the priority of Japanese patent application No. 2006-302956, filed on Nov. 8, 2006, the disclosure of which is incorporated herein in its entirety by reference thereto.

FIELD OF THE INVENTION

The present invention relates to an output circuit, and a data driver and a display device using the output circuit.

BACKGROUND OF THE INVENTION

Recently, as display devices, liquid crystal display (LCD) devices that feature thinness, lightweight, lower power consumption have been widespread used, and have been extensively utilized as display units of mobile devices including portable telephone apparatuses (such as mobile phones or cellular phones), PDAs (personal digital assistants), and notebook PCs. Recently, however, a technology for supporting a larger screen and a moving image of the liquid crystal display devices has been developed. Then, realization of tabletop large-screen display devices and tabletop large-screen liquid crystal TVs as well as display devices and TVs for mobile use have become possible. As these liquid crystal display devices, an active matrix driving system liquid crystal display device capable of performing high-definition display is employed.

First, referring to FIG. 25, a typical configuration of the active matrix driving system liquid crystal display device will be outlined. FIG. 25 schematically shows a main configuration connected to one pixel in a liquid crystal display unit, using an equivalent circuit.

Generally, a display unit 960 of the active matrix driving liquid crystal display device includes a semiconductor substrate, an opposing substrate, and a liquid crystal sealed in between these two substrates by opposing these two substrates. On the semiconductor substrate, transparent pixel electrodes 964 and thin-film transistors (TFTs) 963 are arranged in a matrix form (of 1280×3 pixel rows×1024 pixel columns in the case of a color SXGA panel, for example). One transparent electrode 966 is formed on an entire surface of the opposing substrate.

Turning on and off of a TFT 963 having a switching function is controlled by a scan signal. When the TFT 963 is turned on, a gray scale voltage corresponding to a video signal is applied to a corresponding pixel electrode 964. Transmittance of the liquid crystal is changed by a potential difference between each pixel electrode 964 and the opposing substrate electrode 966, and the potential difference is held by a liquid crystal capacitance 965 for a certain period, thereby displaying an image.

On the semiconductor substrate, data lines 962 and scan lines 961 are wired in the form of a grid (in which 1280×3 data lines and 1024 scan lines are arranged in the case of the color SXGA panel described above). A data line 962 sends a plurality of level voltages (gray scale voltages) applied to each pixel electrode 964, and a scan line 961 sends the scan signal. Due to a capacitance produced at an intersection between each of the scan lines 961 and each of the data lines 962 and a liquid crystal capacitance sandwiched between the semiconductor substrate and the opposing substrate, the scan lines 961 and the data lines 962 have become a large capacitive load.

The scan signal is supplied to a scan line 961 from a gate driver 970, and a gray scale voltage is supplied to each pixel electrode 964 from a data driver 980 through a data line 962.

Rewriting of data of one screen is usually performed in one frame period (of approximately 1/60 seconds). Data is successively selected every pixel row (every line) by each scan line, and a gray scale voltage is supplied from each data line within a selection period.

While the gate driver 970 should supply the scan signal of at least two values, the data driver 980 needs to drive a data line by the gray scale voltage of multi-valued levels corresponding to the number of gray scales. For this reason, the data driver 980 includes a decoder that converts video data to a gray scale voltage signal and a digital-to-analog converter circuit (DAC) formed of an operational amplifier that amplifies a voltage of the gray scale voltage signal, for output to a corresponding data line 962.

Recently, image quality of liquid crystal display devices has been improved (or the number of colors used in the liquid crystal display devices has been increased). There has been a growing demand for at least 260 thousand colors (video data of six bits for each of colors of R, G, B) and 16,770 thousand colors (video data of eight bits for each of the colors of R, G, B), and 1,074,000 thousand colors (video data of 10 bits for each of the colors of R, G, B) or more.

For this reason, for a data driver that outputs a gray scale voltage corresponding to multi-bit video data, a voltage output with high accuracy is demanded. In addition, the number of devices in a circuit portion that handles the video data has increased, and the chip area of a data driver LSI has increased, which has become a factor in resulting in high cost. This problem will be described below in detail.

FIG. 26 is a diagram showing a configuration of the data driver 980 in FIG. 25, and showing a main portion of the data driver 980 using blocks. Referring to FIG. 26, the data driver 980 is configured by including a latch address selector 981, a latch 982, a reference voltage generation circuit (gray scale voltage generation circuit) 983, decoders 984, and amplifiers (buffer circuits) 985.

Based on a clock signal CLK, the latch address selector 981 determines a data latch timing. The latch 982 latches digital video data based on the timing determined by the latch address selector 981, and outputs the data to each of the decoders 984 in response to an STB signal (strobe signal) in unison. The reference voltage generation circuit 983 generates reference voltages (gray scale voltages) the number of which is the number of gray scales corresponding to the video data. Each decoder 984 selects one of the reference voltages corresponding to input data and outputs the selected reference voltage. Each of the amplifiers 985 receives the gray scale voltage output from a corresponding one of the decoders 984 and performs current amplification, for output as an output voltage Vout.

When 6-bit video data is input, the number of gray scales is 64. Then, the reference voltage generation circuit 983 generates the reference voltages (gray scale voltages) of 64 levels. The decoder 984 has a circuit configuration in which the decoder 984 selects one gray scale voltage from among the gray scale voltages of 64 levels.

On the other hand, when 8-bit video data is input, the number of gray scales becomes 256. Then, the reference voltage generation circuit 983 generates the reference voltages (gray scale voltages) of 256 levels. The decoder 984 has a circuit configuration in which the decoder 984 selects one gray scale voltage from among the gray scale voltages of 256 levels.

On the other hand, when 10-bit video data is input, the number of gray scales becomes 1024. Then, the reference voltage generation circuit 983 generates the reference voltages (gray scale voltages) of 1024 levels. The decoder 984 has a circuit configuration in which the decoder 984 selects one gray scale voltage from among the gray scale voltages of 1024 levels.

As described above, when the number of bits of video data is increased, a circuit size of each of the reference voltage generation circuit 983 and the decoders 984 increases. When the video data is increased from six bits to eight bits, the circuit size becomes not less than four times of that for six bits. When the video data is increased from six bits to 10 bits, the circuit size becomes not less than 16 times of that for six bits.

Accordingly, the chip area of the data driver LSI is increased, thus leading to high cost due to an increase in bits of the video data.

On contrast therewith, as a technology for restraining an increase in the chip area of the data driver LSI even if the number of bits of video data is increased, a description in U.S. Pat. No. 6,246,351 (Patent Document 1) is referred to.

FIG. 27 is a diagram for explaining the technology disclosed in Patent Document 1 (corresponding to FIG. 2 in Patent Document 1). Referring to FIG. 27, a DAC in FIG. 27 is formed of a string DAC unit (decoder unit) 4001 and an interpolating amplifier unit 4100. The string DAC unit (decoder unit) 4001 includes a string constituted from a set of resistance elements R000 to R255 and switches S000 to S255 which select a set of voltages at both ends of a resistance. The interpolating amplifier unit 4100 includes a differential amplifier including a plurality of differential pairs of the same polarity and switches 4004 for selectively receiving voltages supplied to two input terminals 4002 and 4003 to non-inverting inputs of the differential amplifier.

In the string DAC unit 4001, by the switches S000 to S255 controlled by higher-order M bits of digital data, two voltages at both ends of one resistance among the resistance elements R000 to R255 of the resistor string are selected. Then, the selected voltages are supplied to input terminals 4002 and 4003 of the interpolating amplifier unit 4100, respectively.

The two voltages selected by the switches are limited to the voltages at both ends of the one resistance among the resistance elements R000 to R255 of the resistor string. Voltages at both ends of a plurality of the resistance elements are not selected, or the same voltage is not selected.

The interpolating amplifier unit 4100 selectively inputs voltages V1 and V2 supplied to the input terminals 4002 and 4003, respectively, to non-inverting inputs 4111, 4121, 4131, and 4141 by the switches 4004 controlled by lower-order N bits of the digital data, and can output a voltage obtained by internally dividing the voltages V1 and V2 at an arbitrary ratio, according to a ratio between the number of the voltages V1 and the number of the voltages V2. The non-inverting input 4111 of a differential pair 4110 is connected to the input terminal 4002. An output terminal Vout is feedback connected to an inverting input 4112 of the differential pair 4110, an inverting input 4122 of a differential pair 4120, an inverting input 4232 of a differential pair 4130, and an inverting input 4142 of a differential pair 4140.

Since the four differential pairs (4110, 4120, 4130, 4140) are provided in FIG. 27, voltages obtained by internally dividing the voltage V1 at the terminal 4002 and the voltage V2 at the terminal 4003 at a ratio of 1:3, 1:1, and 3:1 and four voltages of a voltage Vin2 can be output, due to an LSB (Least Significant Bit).

Accordingly, for the number of voltage levels to be output, the number of input voltage levels can be reduced to even the inverse of the number of differential pairs. For this reason, the number of power supply lines of the string DAC unit and the area of the string DAC unit can be reduced.

A technology for implementing an increase in accuracy of an output voltage in addition to area saving of a data driver, a configuration in FIG. 15 of JP Patent Kokai Publication No. JP-P-2001-343948A (Patent Document 2), for example, can be pointed out.

FIG. 28 shows an example of a configuration of an amplifier circuit in an output unit of a data driver corresponding to the configuration in FIG. 15 in the document described above. Referring to FIG. 28, the amplifier circuit is configured by including an amplifier 85-1 and a switch circuit 42. The amplifier 85-1 is the amplifier capable of outputting a voltage obtained by 1:1 internal division of voltages input to terminals IN1 and IN2 to a terminal OUT. Since the number of input power supply lines can be reduced to a half of the number of voltage levels to be output, the area of a DAC portion can be reduced. Connection among each of differential input terminals for the amplifier, each of the terminals IN1 and IN2, and output terminal OUT is controlled by the switch circuit 42, and can assume the following four states.

(1) First State:

Terminals Q12 and Q13 are connected to the terminals IN1 and IN2, respectively. Terminals Q11 and Q14 are connected to the output terminal OUT.

(2) Second State:

The terminals Q12 and Q13 are connected to the terminals IN2 and IN1, respectively. The terminals Q11 and Q14 are connected to the output terminal OUT.

(3) Third State:

The terminals Q11 and Q14 are connected to the terminals IN1 and IN2, respectively. The terminals Q12 and Q13 are connected to the output terminal OUT.

(4) Fourth State:

The terminals Q11 and Q14 are connected to the terminals IN2 and IN1, respectively. The terminals Q12 and Q13 are connected to the output terminal OUT.

Then, the four states described above are switched according to a predetermined cycle. An output offset caused by threshold value variations of transistors forming the amplifier 85-1 is time averaged, and cancelled.

Accordingly, by using the configuration in FIG. 28, the area of the DAC portion can be reduced. An output accuracy of the amplifier 85-1 can also be improved.

However, it is inferred that, since two gray scale voltages are supplied to non-inverting input terminals in the third and fourth states in the configuration in FIG. 28, the data driver cannot output a desired voltage properly.

In the case of FIG. 28, it is inferred that when the first and second states are switched, there is a certain effect on cancellation of the output offset.

[Patent Document 1]

U.S. Pat. No. 6,246,351 (FIG. 2)

[Patent Document 2]

JP Patent Kokai Publication No. JP-P-2001-343948A (FIG. 15)

SUMMARY OF THE DISCLOSURE

The entire disclosure of Patent Documents 1 and 2 are incorporated herein by reference thereto.

As described above, according to the configuration shown in FIG. 27 (shown in Patent Document 1), the more the number of the differential pairs is increased, the more an effect of reducing the area of the string DAC unit can be improved. However, the improvement in accuracy achieved by state switching as shown in FIG. 28 cannot be implemented.

When the accuracy of the amplifier is deteriorated as described above, variations in output voltages of respective outputs of the data driver will arise. As a result, a defect such as display unevenness or a vertical streak will appear on a liquid crystal display screen.

On the other hand, according to the configuration (Patent Document 2) shown in FIG. 28, by switching the four connection states, a highly accurate output voltage can be obtained. However, this connection switching can be applied only to an amplifier having two differential pairs as shown in the amplifier 85-1 in FIG. 28, and cannot be applied to the amplifier having the arbitrary number of differential pairs as shown in FIG. 27.

According to the configuration (Patent Document 2) shown in FIG. 28, the improvement in accuracy can be realized. However, area saving of the DAC portion cannot be implemented so much as the configuration shown in FIG. 27.

Accordingly, when an output circuit in FIG. 28 is used for a data driver, variations in output voltages of respective outputs of the data driver can be restrained, and image quality of a liquid crystal display screen can be improved. However, there is a problem that cost of the data driver becomes higher than in a case where a data driver using an output circuit in FIG. 27 is configured.

As an approach to solving these problems or simultaneously realizing area saving and improvement in accuracy of a data driver, application of switching between the two states to FIG. 27 may be conceived. The switching between the two states refers to switching between the first and third states, or switching between the second state and the fourth state, for example. The switching between the two states means interchange between an inverting input side and a non-inverting input side in the differential amplifier in FIG. 28.

According to this approach, an error caused by mismatching between corresponding devices on the inverting input side and the non-inverting input side of the interpolating amplifier unit 4100 in FIG. 27 (mismatching between transistors on inverting and non-inverting sides of the differential pair 4110 or a load circuit (current mirror) 4150) can be cancelled by the connection switching.

However, mismatching among the differential pairs (e.g. mismatching between an inverting input side transistor of the differential pair 4110 and an inverting input side transistor of the differential pair 4120 and mismatching between current sources) cannot be cancelled.

As described above, in order to enhance the effect of reducing the area of the data driver, it is effective to increase the number of the differential pairs in the interpolating amplifier unit 4100.

However, the more the number of the differential pairs increases, more heavily affects the mismatching among the differential pairs on the accuracy of an output voltage. Thus, when the number of outputs of this amplifier is increased, only switching between inverting inputs and non-inverting inputs may not reduce mutual variations of output voltages of the amplifier.

Further, as another approach, application of an approach to switching all possible states in FIG. 27 may be conceived.

In this approach, connection states corresponding to all combinations of inputs and outputs are switched. Thus, theoretically, mismatching between the non-inverting input side and the inverting input side and the mismatching among the differential pairs can be all cancelled.

However, when the interpolating amplifier unit 4100 in FIG. 27 has N differential pairs, all the states that can be assumed reaches the combinations of as large as $N!\times2$.

When there are two differential pairs, for example, the number of all the combinations is four as in FIG. 28. When the number of differential pairs is three, the number of all the combinations is $3!\times2=12$. When the number of differential pairs is four, the number of all the combinations is $4!\times2=48$. When the number of differential pairs is five, the number of all the combinations is $5!\times2=240$. When the number of differential pairs is increased, the number of combinations of possible states will be rapidly increased.

When this amplifier is employed for a display device, switching of dozens or hundreds of connecting ways in order to cancel all mismatching extremely prolongs the time necessary for canceling an output voltage error due to the mismatching between devices.

For this reason, in this connection switching approach, an output voltage error in each connection state may be recognized as a flicker to human eyes. Then, after all, image quality of a liquid crystal display device will be degraded.

Further, in order to implement switching of dozens or hundreds of connections, a greater number of switches need to be provided for the amplifier in FIG. 27. Thus, there is also a problem that the area of the switches becomes large, and an area saving effect is reduced.

Accordingly, it is an object of the present invention to provide an output circuit in which mismatching between an inverting input side and a non-inverting input side of an amplifier having three or more differential pairs and mismatching among the differential pairs can be canceled by switching of the small number of connection states, thereby allowing area saving and reduction of mutual voltage variations among outputs.

It is another object of the present invention to provide a low-cost and highly accurate data driver with a saved area by using the output circuit described above. Further, another object of the present invention is to provide a display device including a data driver in which cost reduction, reduction of the width of a frame, and higher image quality are implemented.

An output circuit according to an aspect of the present invention includes:

a connection switch that includes first and second terminals for receiving a first voltage and a second voltage, respectively, and first to third intermediate terminals and that selects and supplies the first voltage or the second voltage to each of said first to third intermediate terminals, including selection of the same voltage for a plurality of the intermediate terminals, said connection switch switching assignment of the first voltage and the second voltage to said first to third intermediate terminals responsive to a connection switching signal; and an operation unit that receives the voltages supplied to said first to third intermediate terminals, and outputs to an output terminal of said output circuit a voltage obtained by performing a predetermined operation on the voltages supplied to said first to third intermediate terminals.

In the present invention, the connection switch performs switching between a first connection state and a second connection state responsive to the connection switching signal;

in the first connection state, the connection switch outputs the first voltage, the second voltage, and the second voltage to the first, second, and third intermediate terminals, respectively;

in the second connection state, the connection switch outputs the second voltage, the second voltage, and the first voltage to the first, second, third intermediate terminals, respectively; and the operation unit outputs to the output terminal an average voltage of the voltages supplied to the first to third intermediate terminals.

In the connection switch of the present invention, a switch is connected between a first terminal with the first voltage applied thereto and the first intermediate terminal, and a switch is connected between a second terminal with the second voltage applied thereto and the third intermediate terminal, the switches being controlled by the connection switching signal;

a switch is connected between the first terminal and the third intermediate terminal, and a switch is connected between the second terminal and the first intermediate terminal, the switches being controlled by a complementary signal of the connection switching signal; and the second terminal is connected to the second intermediate terminal, and the second voltage is output to the second intermediate terminal irrespective of a state of the connection switching signal.

An output circuit according to another aspect of the present invention includes:

a connection switch that includes first to third terminals for receiving first to third voltages, respectively, and first to seventh intermediate terminals, and that selects and supplies the first voltage, the second voltage, or the third voltage to each of said first to seventh intermediate terminals including selection of the same voltage for a plurality of the intermediate terminals, said connection switch switching assignment of the first to third voltages to said first to seventh intermediate terminals responsive to a connection switching signal; and an operation unit that receives the voltages supplied to said first to seventh intermediate terminals, and outputs to an output terminal of said output circuit a voltage obtained by performing a predetermined operation on the voltages supplied to said first to seventh intermediate terminals.

In the output circuit according to the present invention, the connection switch performs switching between a first connection state and a second connection state responsive to the connection switching signal;

in the first connection state, the connection switch outputs the first voltage to the first intermediate terminal, outputs the second voltage to the second and third intermediate terminals, and outputs the third voltage to the fourth through seventh intermediate terminals; and in the second connection state, the connection switch outputs the third voltage to the first through fourth intermediate terminals, outputs the second voltage to the fifth and sixth intermediate terminals, and outputs the first voltage to the seventh intermediate terminal. The operation unit outputs to the output terminal an average voltage of the voltages supplied to the first to seventh intermediate terminals.

In the output circuit according to the present invention, the connection switch includes:

a first switch connected between a first terminal with the first voltage applied thereto and said first intermediate terminal;

a second switch connected between a second terminal with the second voltage applied thereto and said second intermediate terminal;

a third switch connected between the second terminal and said third intermediate terminal;

a fourth switch connected between said third terminal with the third voltage applied thereto, and said fifth intermediate terminal;

a fifth switch connected between said third terminal and said sixth intermediate terminal;

a sixth switch connected between said third terminal and said seventh intermediate terminal;

said first to sixth switches being on/off controlled by the connection switching signal;

a seventh switch connected between said first terminal and said seventh intermediate terminal;

an eighth switch connected between said second terminal and said fifth intermediate terminal;

a ninth switch connected between said second terminal and said sixth intermediate terminal;

a tenth switch connected between said third terminal and said first intermediate terminal;

an eleventh switch connected between said third terminal and said second intermediate terminal; and a twelfth switch connected between said third terminal and said third intermediate terminal;

said seventh to twelfth switches being on/off controlled by a complementary signal of the connection switching signal;

said third terminal being connected to said fourth intermediate terminal, and the third voltage being output to said fourth intermediate terminal irrespective of a state of the connection switching signal.

In the output circuit according to the present invention, the operation unit comprises a differential amplifier and a polarity switch. The differential amplifier includes:

first to third differential pairs;

first to third current sources that supply currents to said first to third differential pairs, respectively;

a load circuit connected in common to output pairs of said first to third differential pairs;

first outputs of output pairs of said first to third differential pairs being connected in common to a first connection node; and second outputs of output pairs of said first to third differential pairs being connected in common to a second connection node;

an amplification stage having an output terminal thereof connected to said output terminal of said output circuit; and a switching circuit that connects said first connection node or said second connection node to an input terminal of said amplification stage responsive to a predetermined control signal.

The polarity switch performs switching between a first connection state and a second connection state responsive to the control signal; wherein in the first connection state, said first to third intermediate terminals of said connection switch are connected to first inputs of respective input pairs of said first to third differential pairs, respectively, and said output terminal of said differential amplifier being connected to second inputs of said respective input pairs of said first to third differential pairs, and in the second connection state, said output terminal of said differential amplifier is connected to the first inputs of said respective input pairs of said first to third differential pairs, and said first to third intermediate terminals of said connection switch are connected to the second inputs of said respective input pairs of said first to third differential pairs, respectively.

In the present invention, in the differential amplifier, sizes of devices forming the first to third differential pairs are set to be equal to one another; and current values of the first to third current sources are set to be equal to one another.

The operation unit according to the present invention comprises a differential amplifier and a polarity switch.

The differential amplifier includes:

first to seventh differential pairs;

first to seventh current sources that supply currents to said first to seventh differential pairs, respectively;

a load circuit connected in common to output pairs of said first to seventh differential pairs;

first outputs of output pairs of said first to seventh differential pairs being connected in common to a first connection node; and second outputs of output pairs of said first to seventh differential pairs being connected in common to a second connection node;

an amplification stage having an output terminal thereof connected to said output terminal of said output circuit; and a switching circuit that connects said first connection node or said second connection node to an input terminal of said amplification stage responsive to a predetermined control signal.

The polarity switch performs switching between a first connection state and a second connection state responsive to the control signal; wherein in the first connection state, said first to seventh intermediate terminals of said connection switch are connected to first inputs of respective input pairs of said first to seventh differential pairs, respectively, and said output terminal of said differential amplifier is connected to second inputs of said respective input pairs of said first to seventh differential pairs; and in the second connection state, said output terminal of said differential amplifier is connected to the first inputs of said respective input pairs of said first to seventh differential pairs, and said first to seventh intermediate terminals of said connection switch are connected to the second inputs of said respective input pairs of said first to seventh differential pairs, respectively.

In the present invention, in the differential amplifier, sizes of devices forming the first to seventh differential pairs are set to be equal to one another; and current values of the first to seventh current sources are set to be equal to one another.

In the present invention, the connection switching signal that controls the connection switch and the control signal that controls the switching device are identical.

In the connection switch in the present invention, a plurality of the switches controlled by the same connection switching signal and having the same input voltage applied thereto are omitted, except one of the plurality of the switches.

In the present invention, the connection switch performs switching between the first connection state and the second connection state at a predetermined time interval, responsive to the connection switching signal; and the output circuit outputs the voltage obtained by performing time averaging of the output voltage of the operation unit in the first connection state and the output voltage of the operation unit in the second connection state.

An output circuit according to another aspect of the present invention includes:

a connection switch that includes first through Mth terminals for receiving first through Mth voltages (V1, V2, . . . , VM), respectively, and first to $(2^M-1)$th intermediate terminals, and that selects and supplies:

the voltage Vi (where i is an integer greater than or equal to 1 and less than or equal to M) to $2^{(i-1)}$ of the first to $(2^M-1)$th intermediate terminals, that is, the voltage V1 to one of the first to $(2^M-1)$th intermediate terminals, the voltage V2 to two of the first to $(2^M-1)$th intermediate terminals, the voltage V3 to four of the first to $(2^M-1)$th intermediate terminals, and the voltage VM to $2^{M-1}$ of the first to $(2^M-1)$th intermediate terminals, wherein said connection switch switches assignment of the first through Mth voltages to said first to $(2^M-1)$th intermediate terminals; and an operation unit that receives the voltages supplied to the first to $(2^M-1)$th intermediate terminals, and outputs to an output terminal of said output circuit an average voltage of the voltages supplied to the first to $(2^M-1)$th intermediate terminals.

In the present invention, said operation unit comprises a differential amplifier and a polarity switch.

The differential amplifier includes:

first to $(2^M-1)$th differential pairs;

said output terminal;

first to $(2^M-1)$th current sources that supply currents to said first to $(2^M-1)$th differential pairs, respectively;

a load circuit connected in common to output pairs of said first to $(2^M-1)$th differential pairs;

first outputs of output pairs of said first to $(2^M-1)$th differential pairs being connected in common to a first connection node; and second outputs of output pairs of said first to $(2^M-1)$th differential pairs being connected in common to a second connection node;

an amplification stage with an output terminal thereof connected to said output terminal; and a switching circuit that connects a first connection node or a second connection node to an input terminal of said amplification stage responsive to a predetermined control signal.

The polarity switch performs switching between a first connection state and a second connection state, wherein in the first connection state, said first to $(2^M-1)$th intermediate terminals of said connection switch are connected to first inputs of respective input pairs of said first to $(2^M-1)$th differential pairs, respectively, and said output terminal of said differential amplifier is connected to second inputs of said respective input pairs of said first to $(2^M-1)$th differential pairs; and in the second connection state, said output terminal of said differential amplifier being connected to the first inputs of said respective input pairs of said first to $(2^M-1)$th differential pairs and said first to $(2^M-1)$th intermediate terminals of said connection switch being connected to the second inputs of said respective input pairs of said first to $(2^M-1)$th differential pairs, respectively.

In the present invention, the connection switch performs switching between a first connection state and a second connection state responsive to the connection switching signal;

in the first connection state, the voltage VM is assigned to $2^{M-1}$ of the first to $(2^M-1)$ intermediate terminals, the voltage V1 is assigned to one of a remainder of the first to $(2^M-1)$ intermediate terminals, the voltage V2 is assigned to two of the remainder of the first to $(2^M-1)$ intermediate terminals, the voltage V3 is assigned to four of the remainder of the first to $(2^M-1)$ intermediate terminals, the voltage V(M−1) is assigned to $2^{(M-2)}$ of the remainder of the first to $(2^M-1)$ intermediate terminals, wherein the voltage Vi (where i is an integer greater than or equal to 1 and less than or equal to M−1) is assigned to $2^{(i-1)}$ of the remainder of the first to $(2^M-1)$ intermediate terminals; and in the second connection state, the voltage VM remains to be assigned to one of the $(2^M-1)$ intermediate terminals with the voltage VM assigned thereto in the first connection state, the voltage V1 is assigned to one of remaining $(2^{(M-1)}-1)$ intermediate terminals, the voltage V2 is assigned to two of the remaining $(2^{(M-1)}-1)$ intermediate terminals, the voltage V3 is assigned to four of the remaining $(2^{(M-1)}-1)$ intermediate terminals, the voltage V(M−1) is assigned to $2^{(M-2)}$ of the remaining $(2^{(M-1)}-1)$ intermediate terminals, wherein the voltage Vi (where i is an integer greater than or equal to 1 and less than or equal to M−1) is assigned to $2^{(i-1)}$ of the remainder of the first to $(2^{M}-1)$ intermediate terminals; and the voltage VM is assigned to all of $(2^{(M-1)}-1)$ intermediate terminals to which the voltages V1 to V(M−1) are assigned in the first connection state.

A data driver according to the present invention that drives data lines based on an input digital data signal, includes the output circuit.

The data driver according to the present invention includes:

a plurality of the output circuits that drive the data lines, respectively; and a connection switching signal that controls the respective connection switches of said output circuits;

wherein the output circuits are divided into two groups, the two groups of the output circuits being controlled by said connection switching signal such that when one group of the output circuits are in the first connection state, the other group of the output circuits are in the second connection state, and that when the one group of the output circuits are in the second connection state, the other group of the output circuits are in the first connection state.

A display device according to the present invention includes:

a data driver including the output circuit; and a display panel;

based on an output signal of the data driver, a data line of the display panel being driven.

A display device according to the present invention includes:

a plurality of data lines arrayed in parallel to one another in one direction;

a plurality of scan lines arrayed in parallel to one another in a direction orthogonal to the one direction;

a plurality of pixel electrodes arranged at intersections between the data lines and the scan lines, in a matrix form;

a plurality of transistors, each having one of a drain and a source thereof connected to a corresponding one of said pixel electrodes, and the other of the drain and the source thereof connected to a corresponding one of said data lines and a gate thereof connected to a corresponding one of said scan lines, each of said transistors corresponding to each of said pixel electrodes;

a gate driver that supplies a scan signal to each of said scan lines; and the data driver that supplies a gray scale signal corresponding to input data to each of said data lines.

The meritorious effects of the present invention are summarized as follows.

According to the present invention, mismatching between an inverting input side and a non-inverting input side of an amplifier having three or more differential pairs and mismatching among the differential pairs are canceled by switching of the small number of connection states. Area saving and reduction of mutual voltage variations among outputs can be thereby implemented.

Further, the present invention accomplishes an effect that, by using the output circuit described above, a low-cost data driver with a saved area is made possible, and that cost reduction, reduction of the width of a frame, and higher image quality of a display device including the data driver can also be implemented.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

BRIEF DESCRIPTIONS OF THE DRAWINGS

FIG. 3 is a table showing relationships between bit data and outputs of a selection circuit in the first embodiment of the present invention;

Figure 7A:
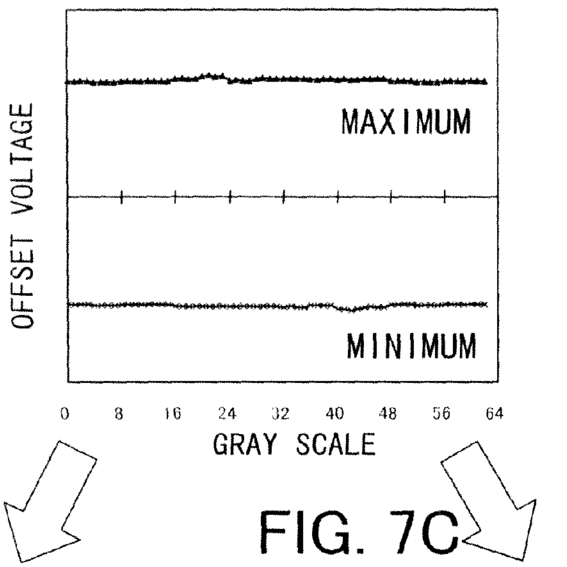
Figure 7B:
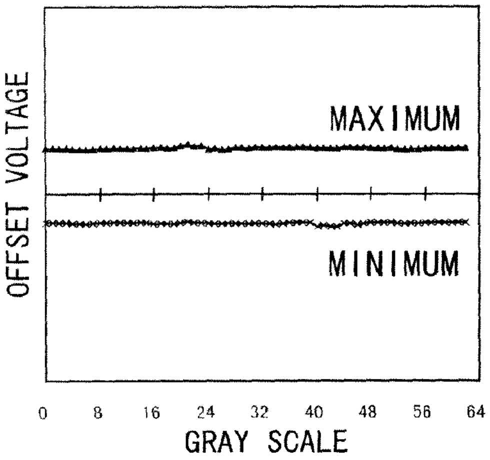
Figure 7C:
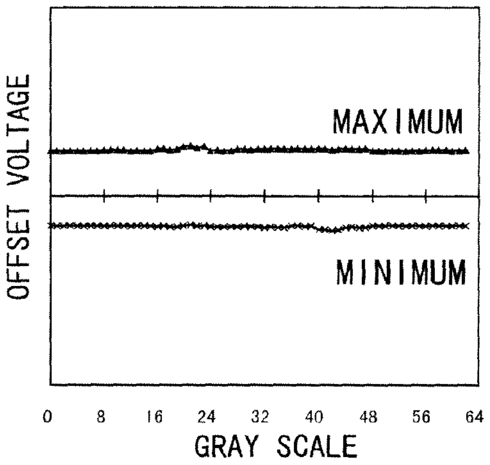
Figure 8A:
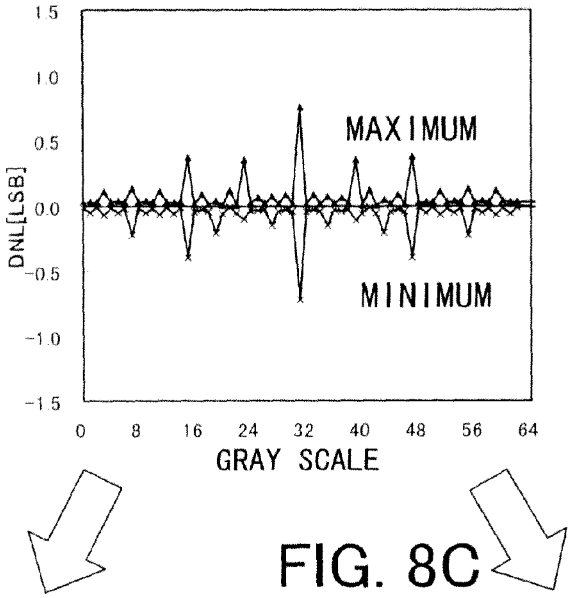
Figure 8B:
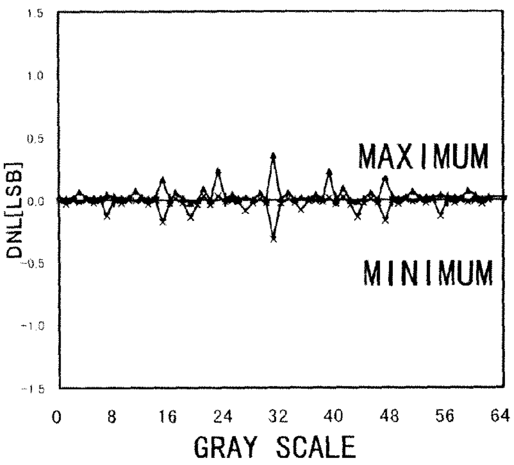
Figure 8C:
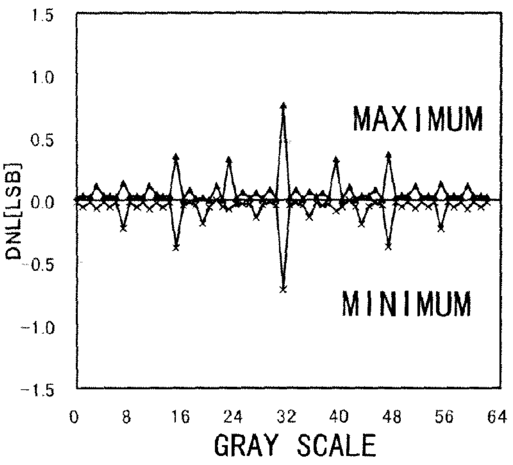
Figure 9:
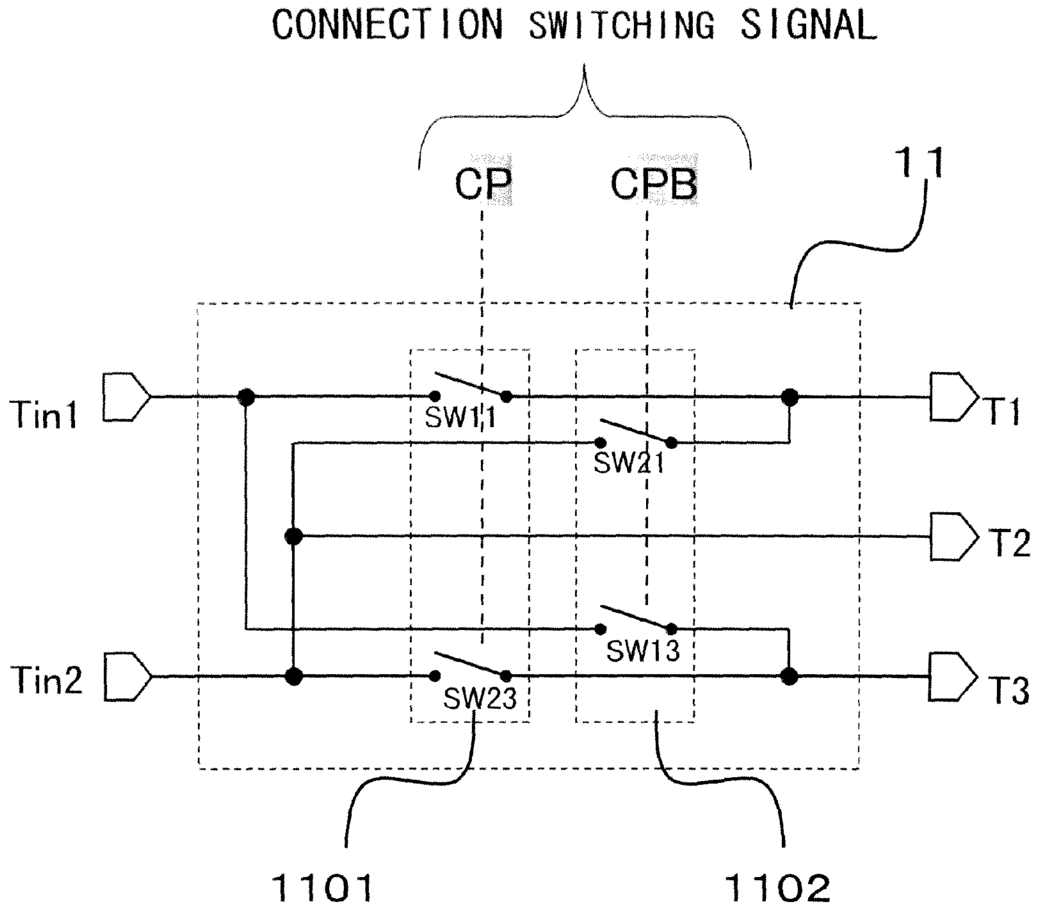
Figure 10:
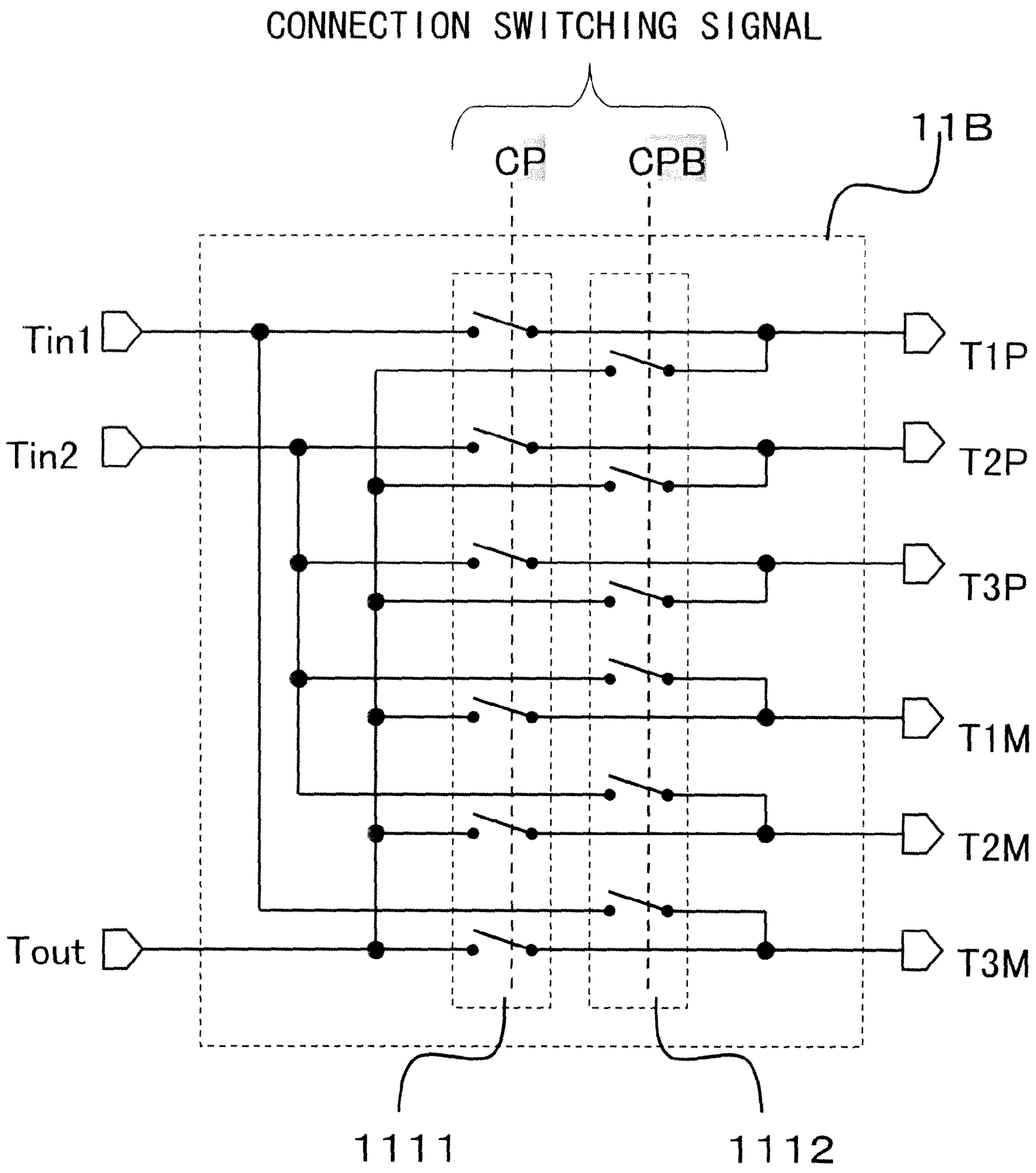
Figure 11:
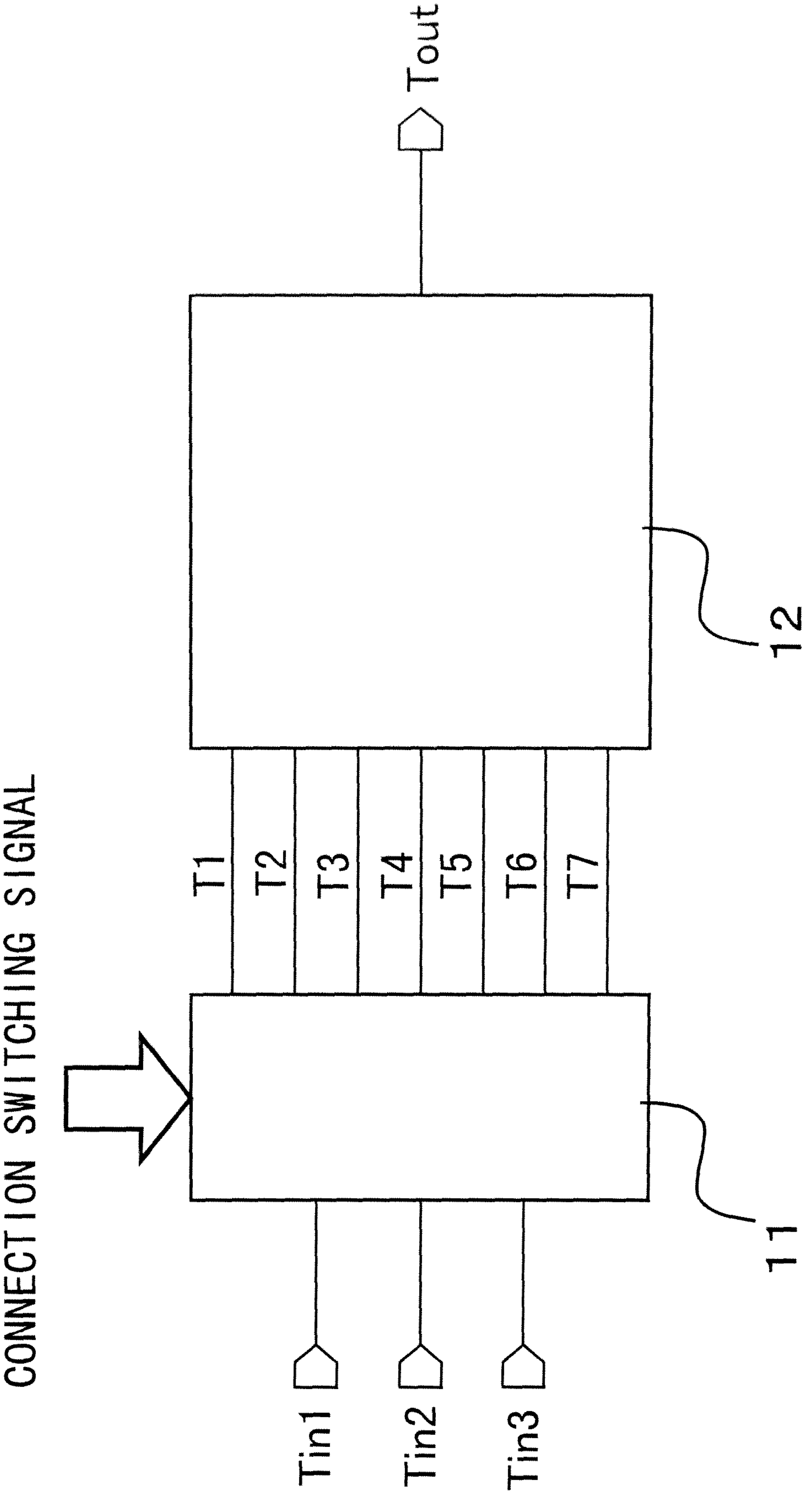
Figure 12:
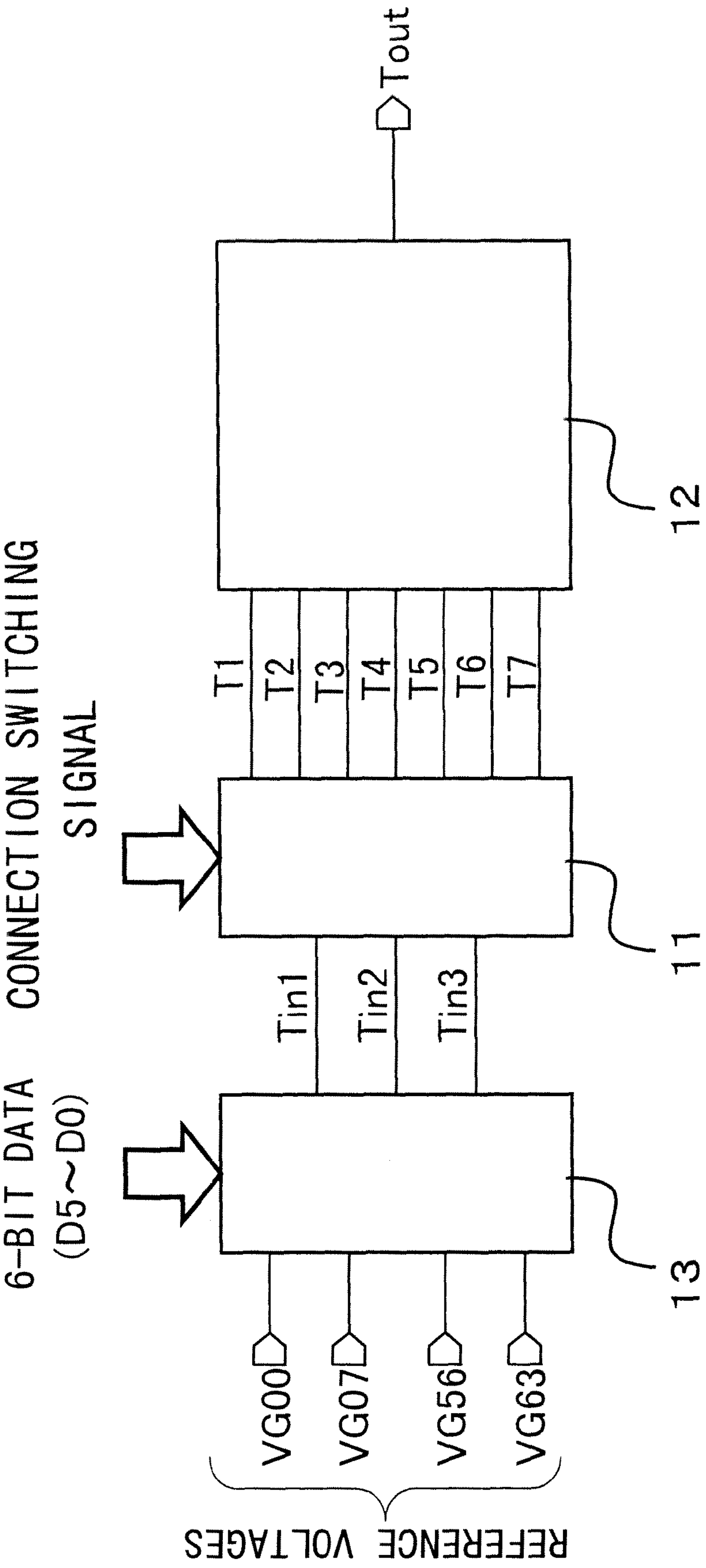
Figure 14:
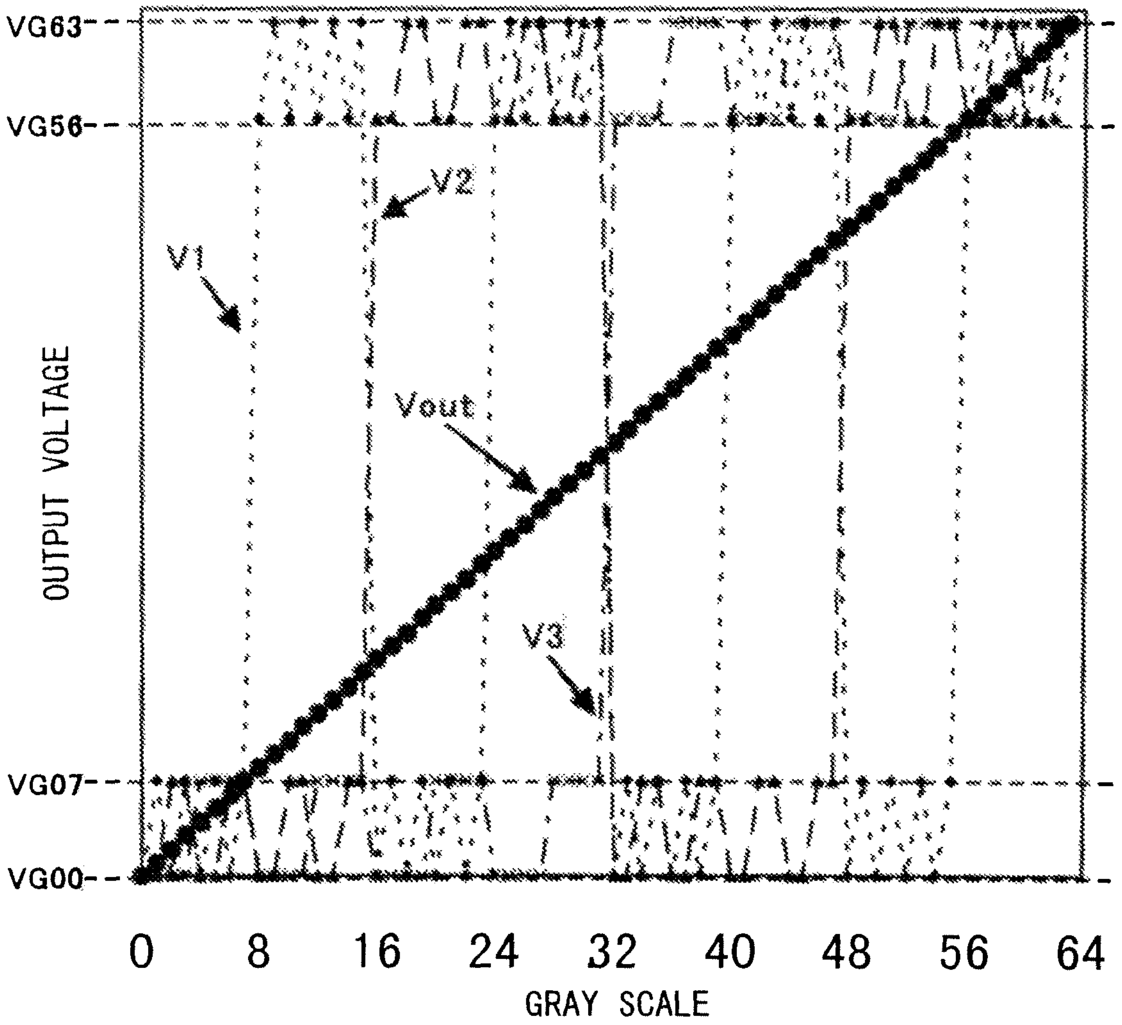
Figure 15:
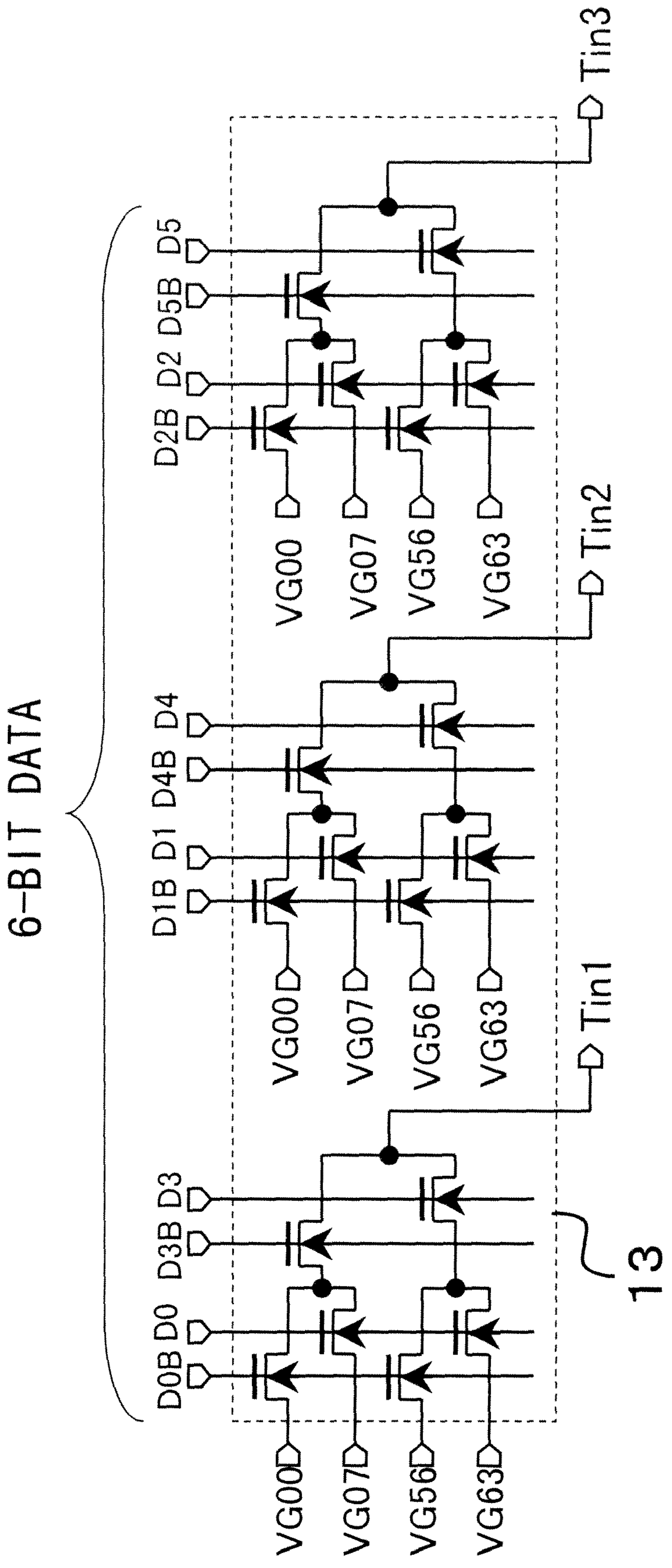
Figure 16:
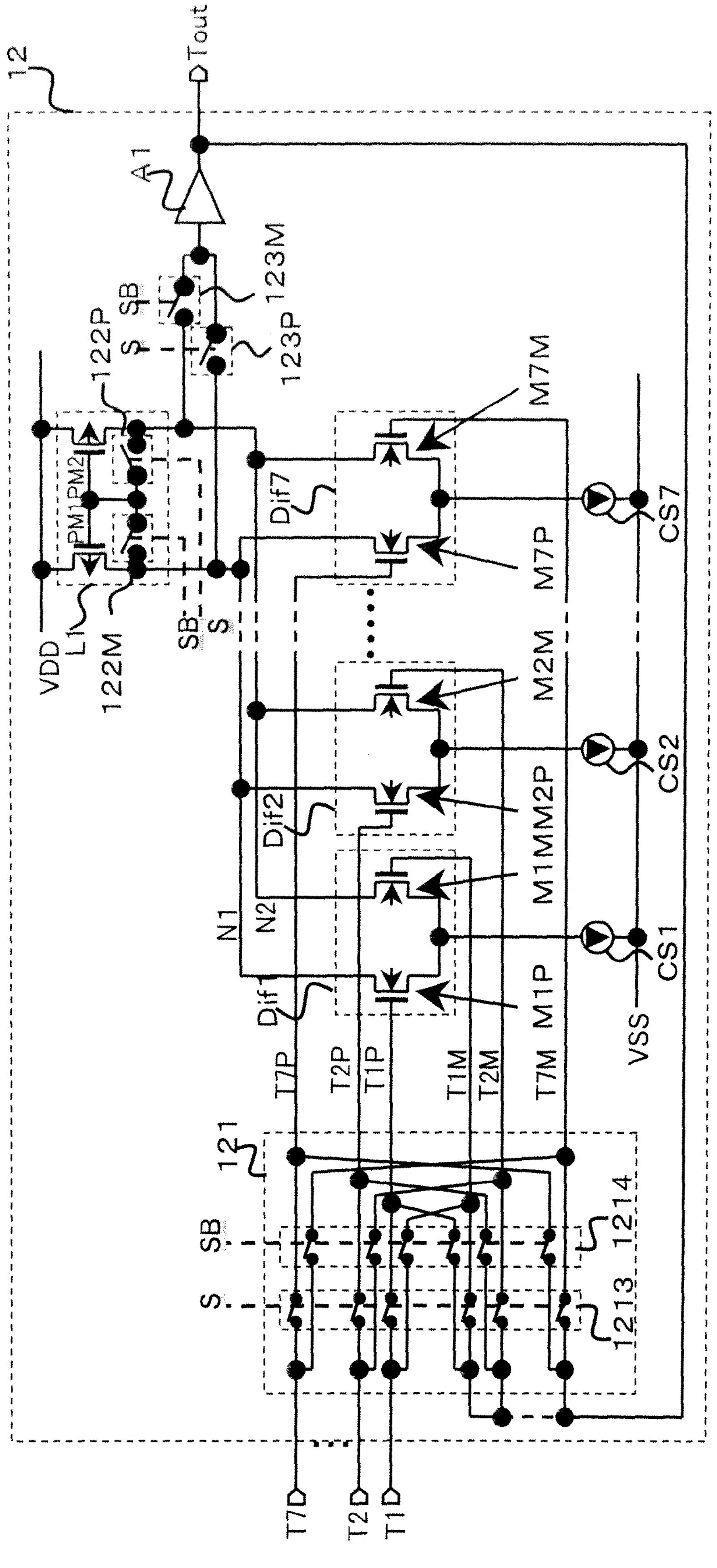
Figure 17A:
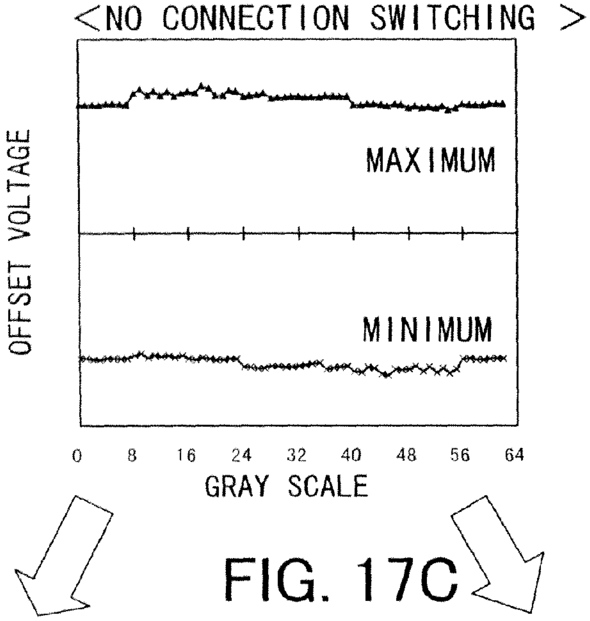
Figure 17B:
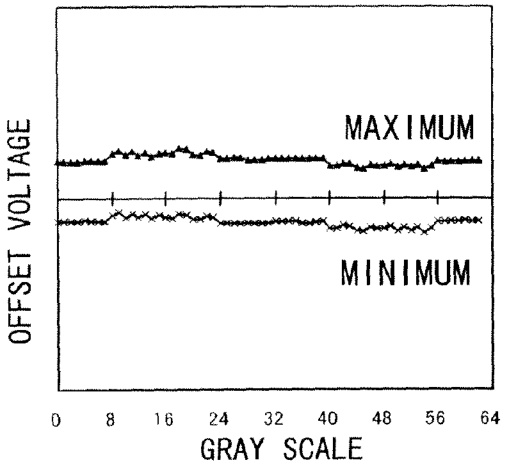
Figure 17C:
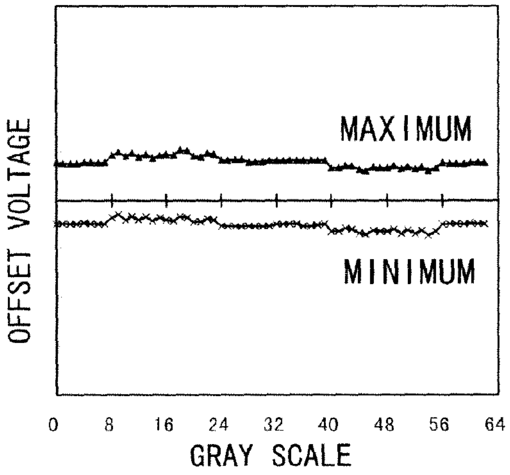
Figure 18A:
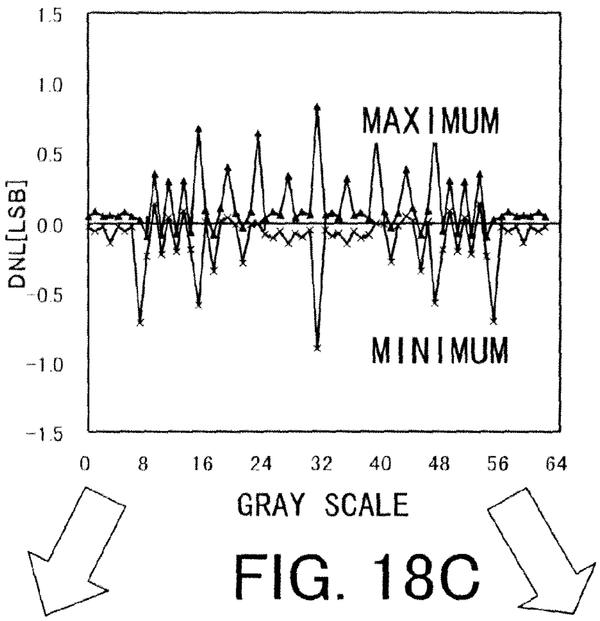
Figure 18B:
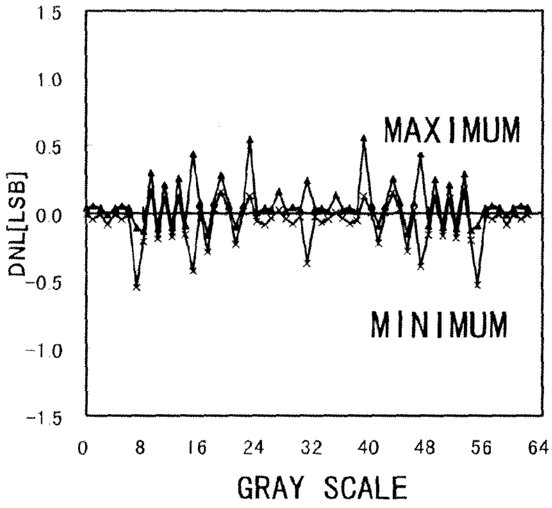
Figure 19:
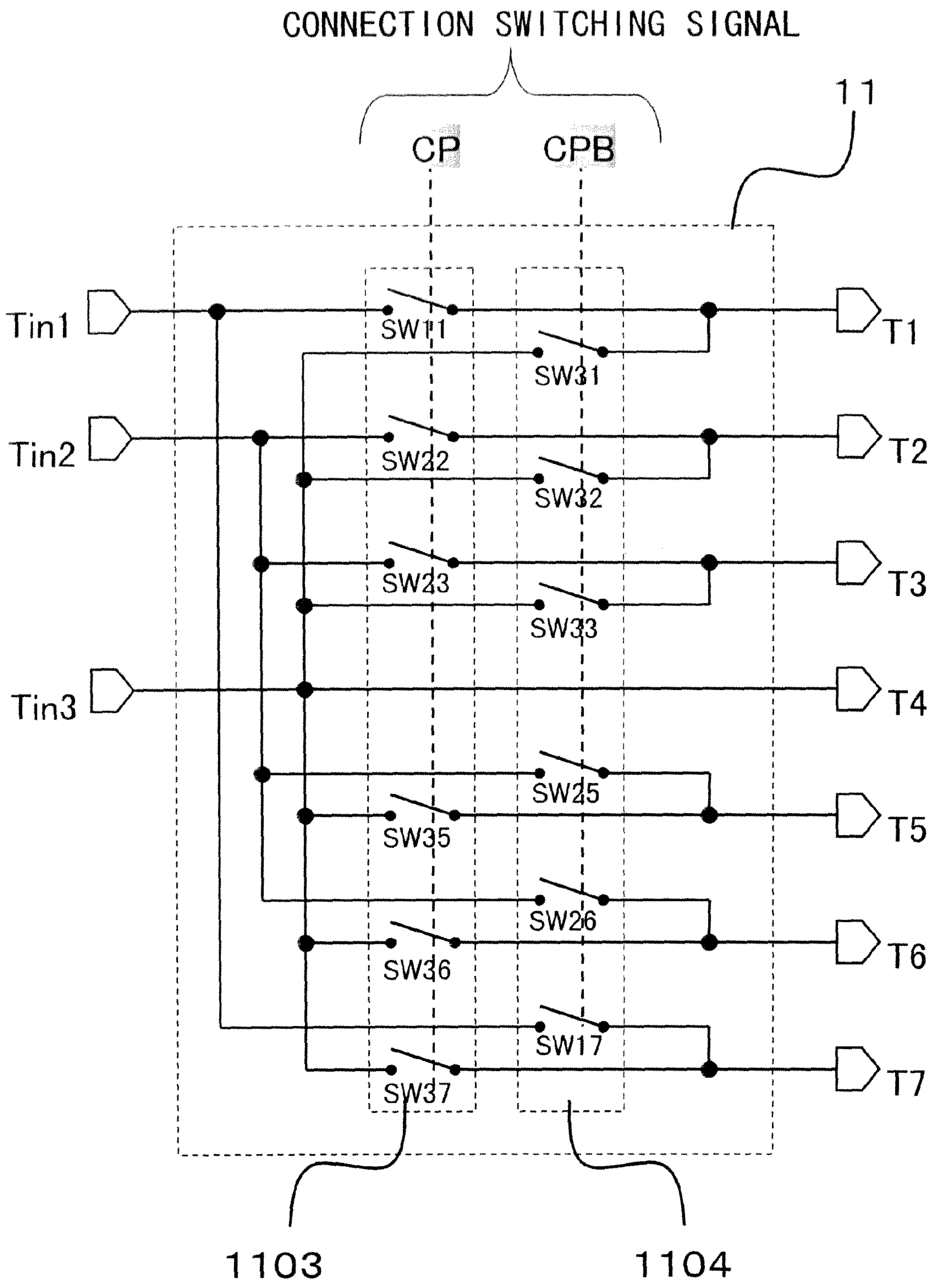
Figure 20:
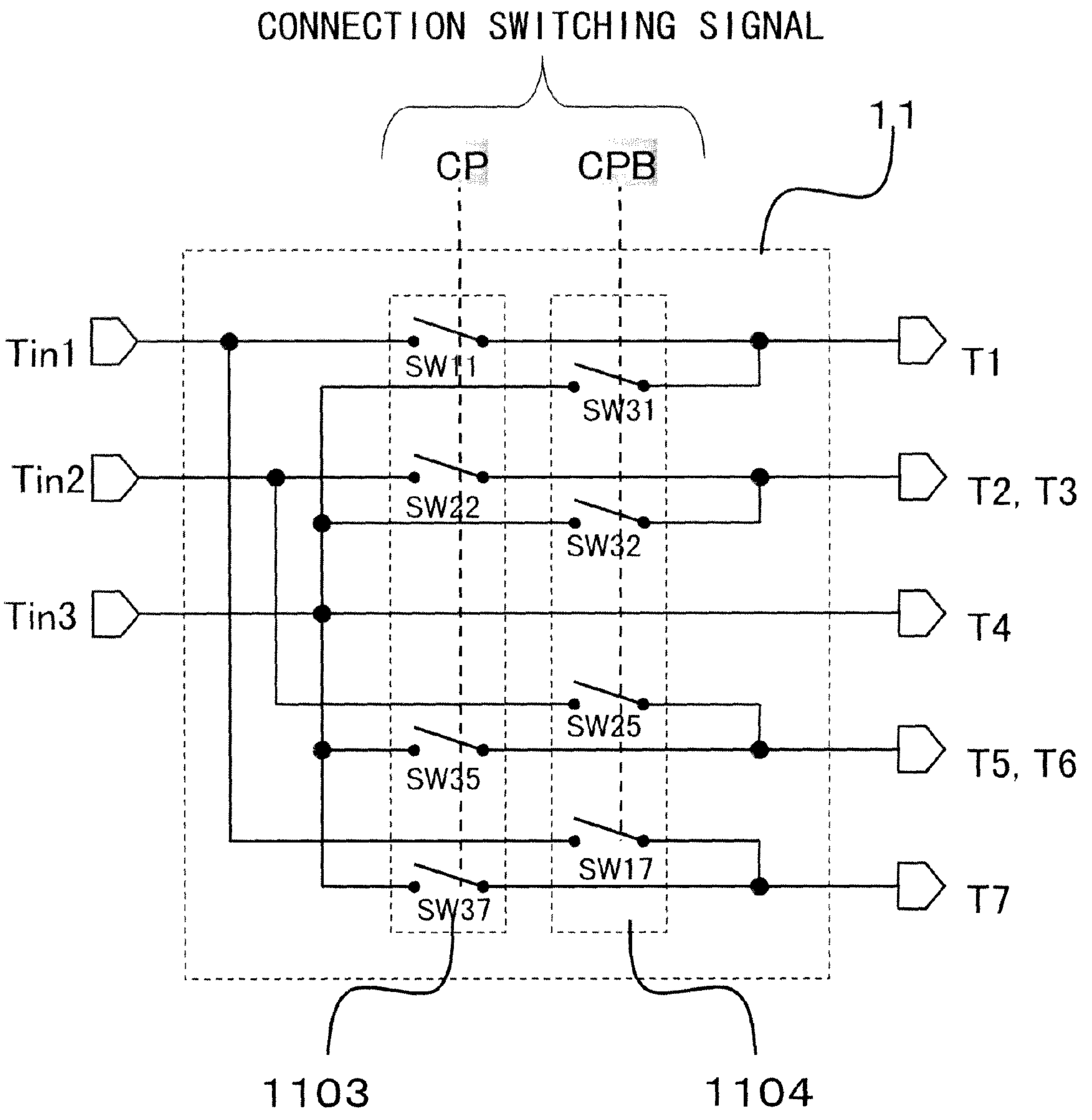
Figure 21:
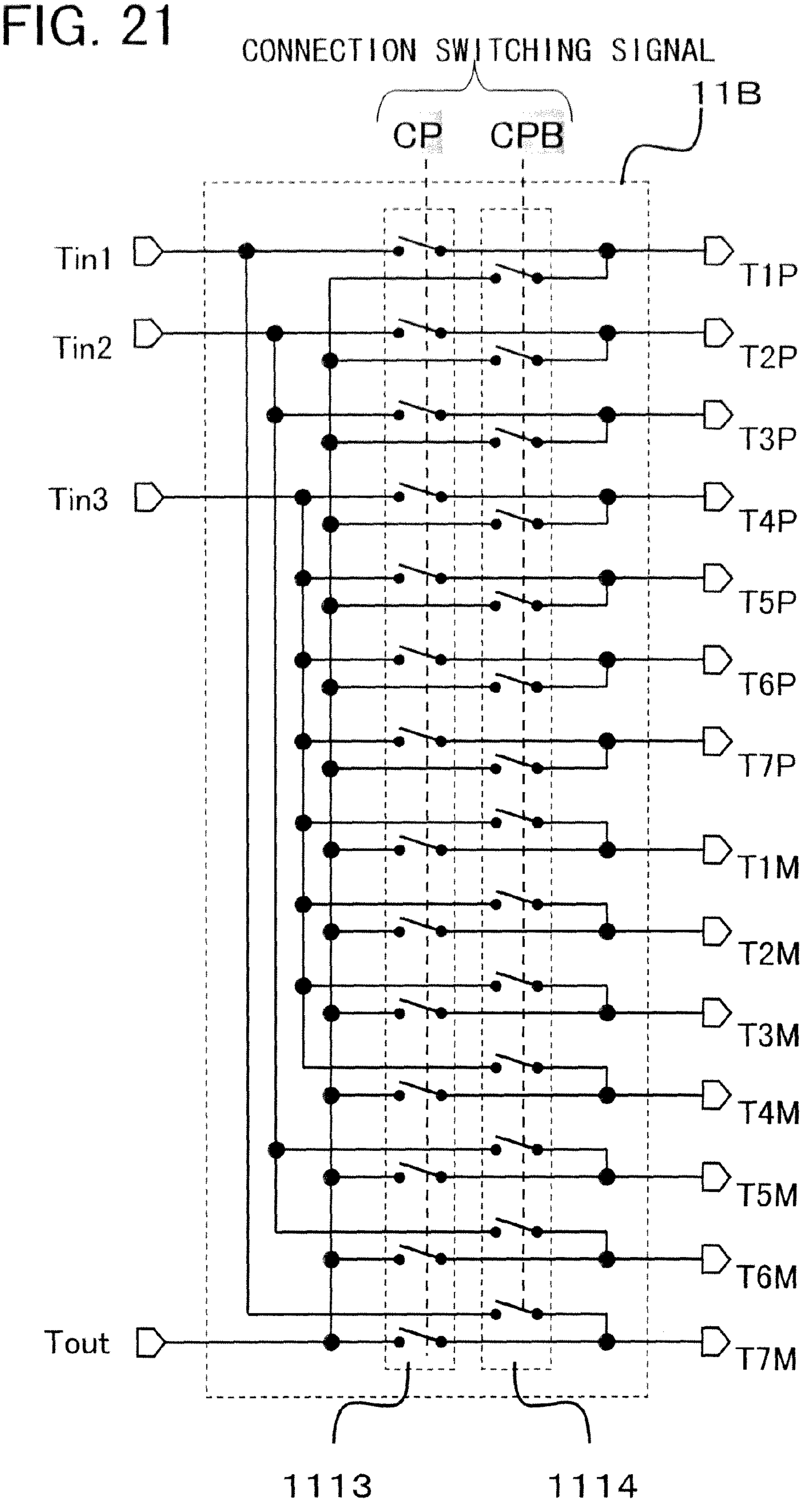
Figure 22:
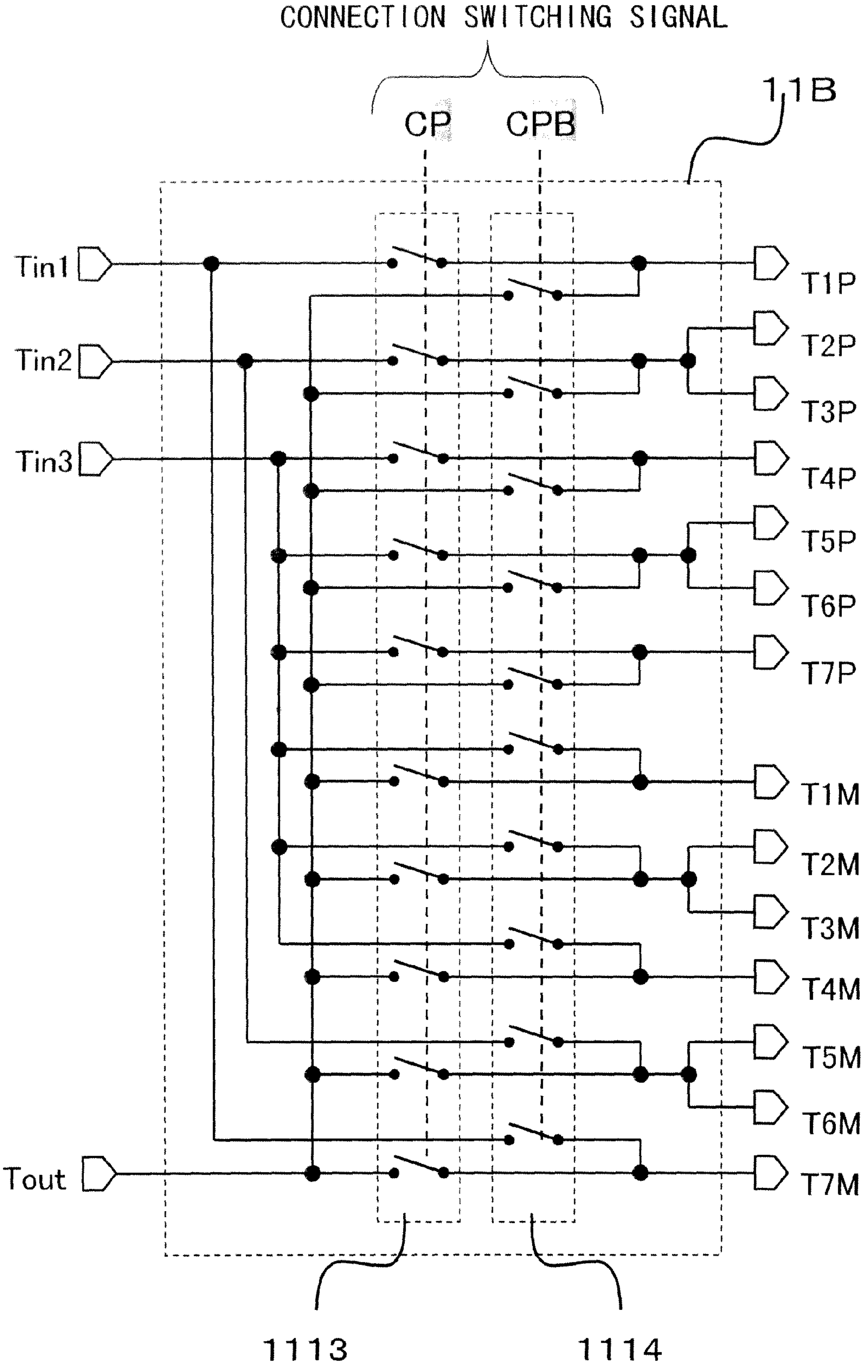
Figure 23:
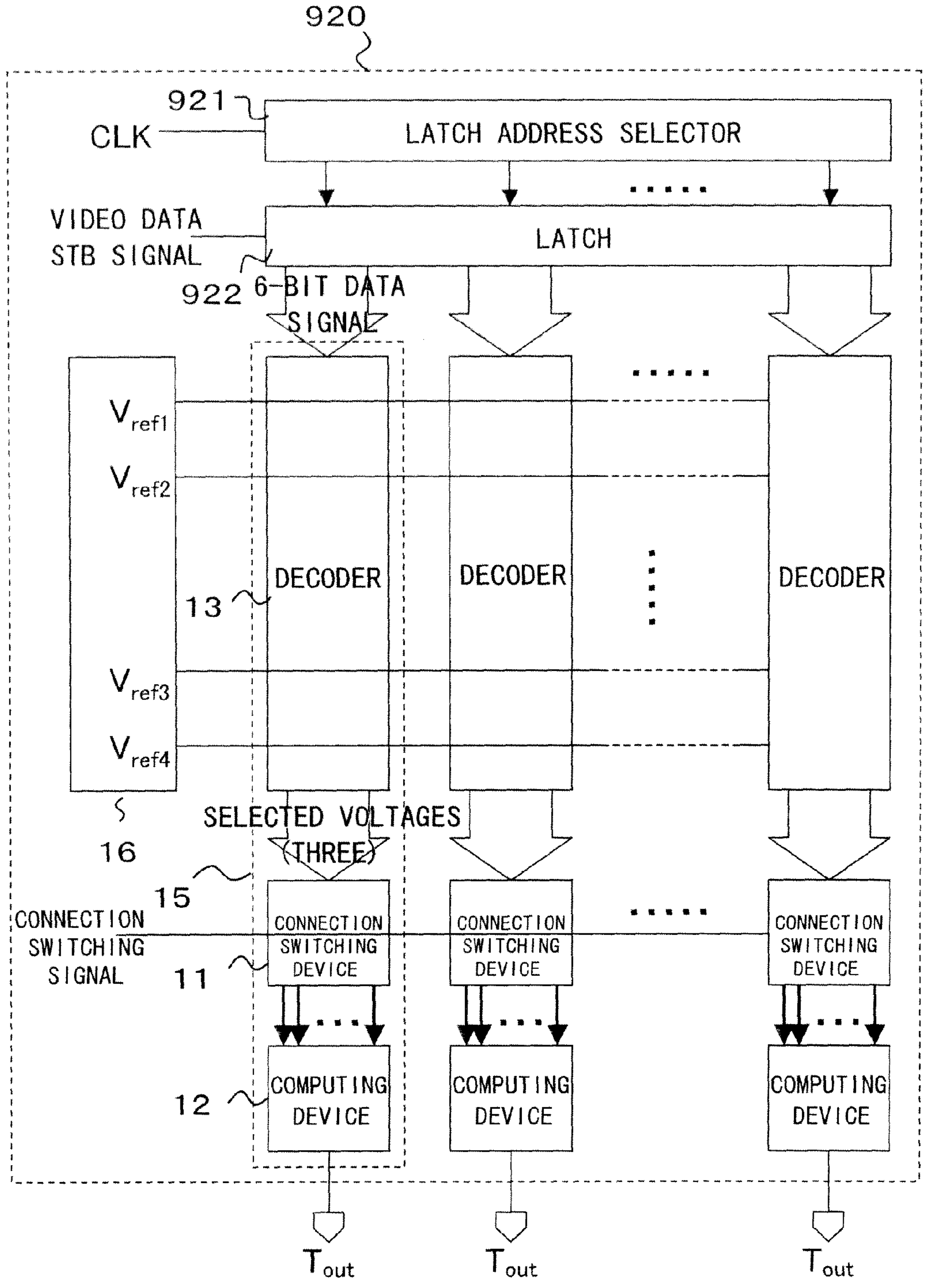
Figure 24:
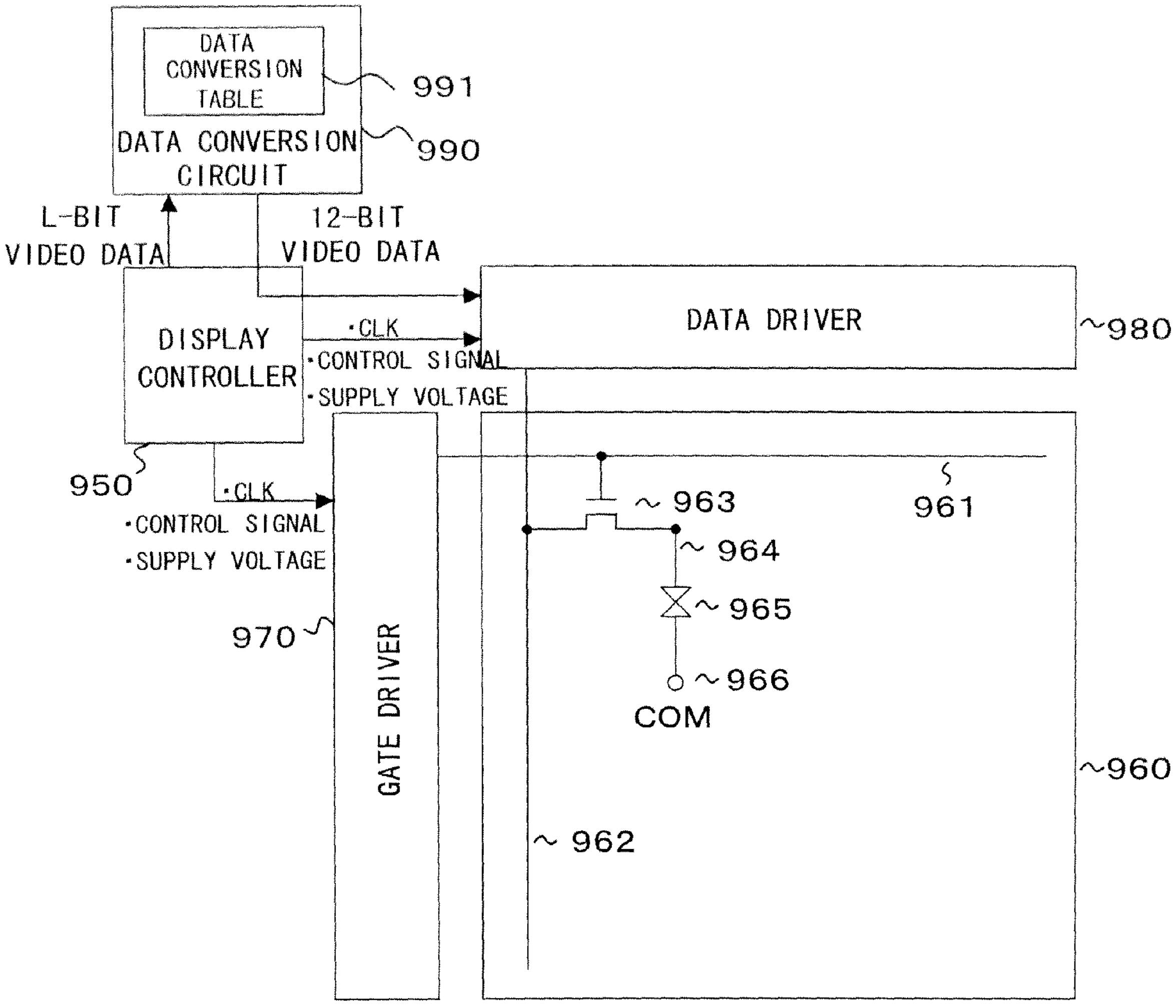
Figure 25:
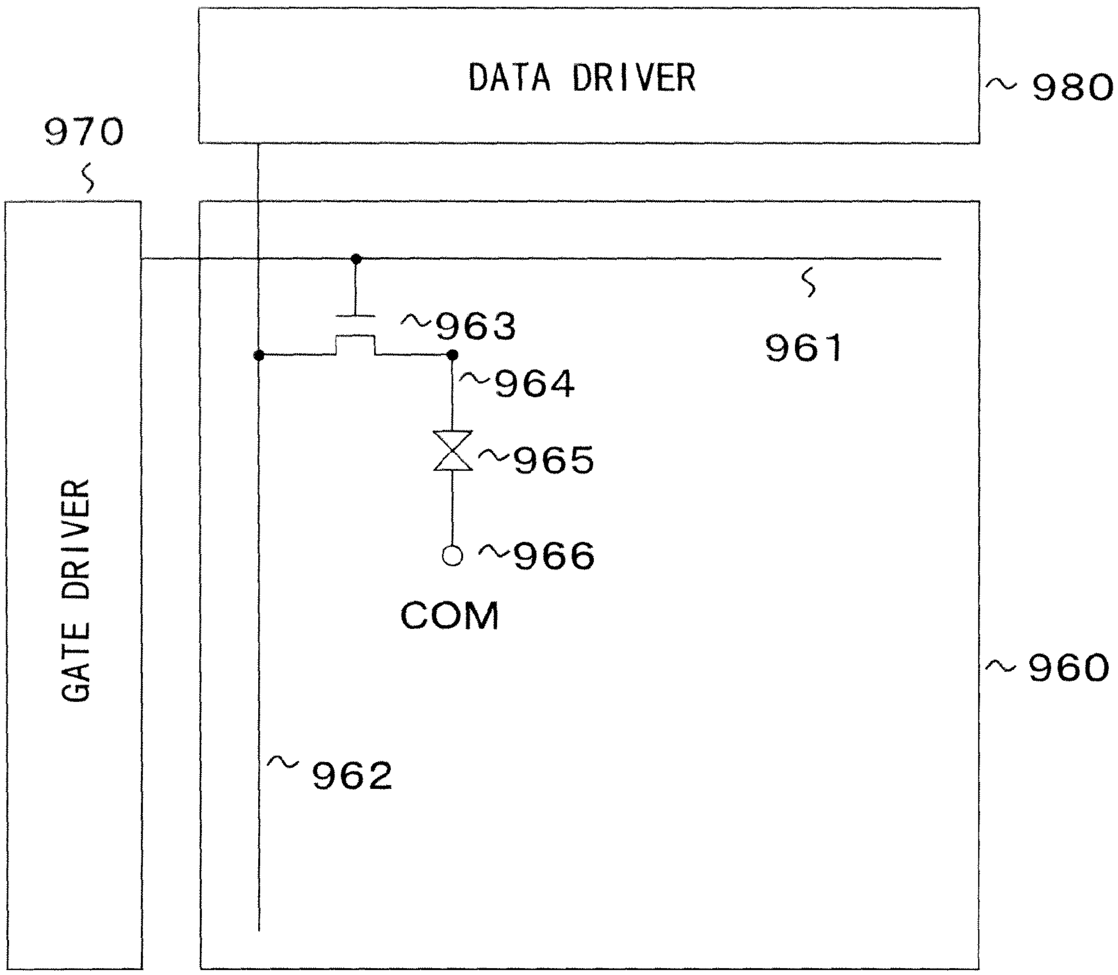
Figure 26:
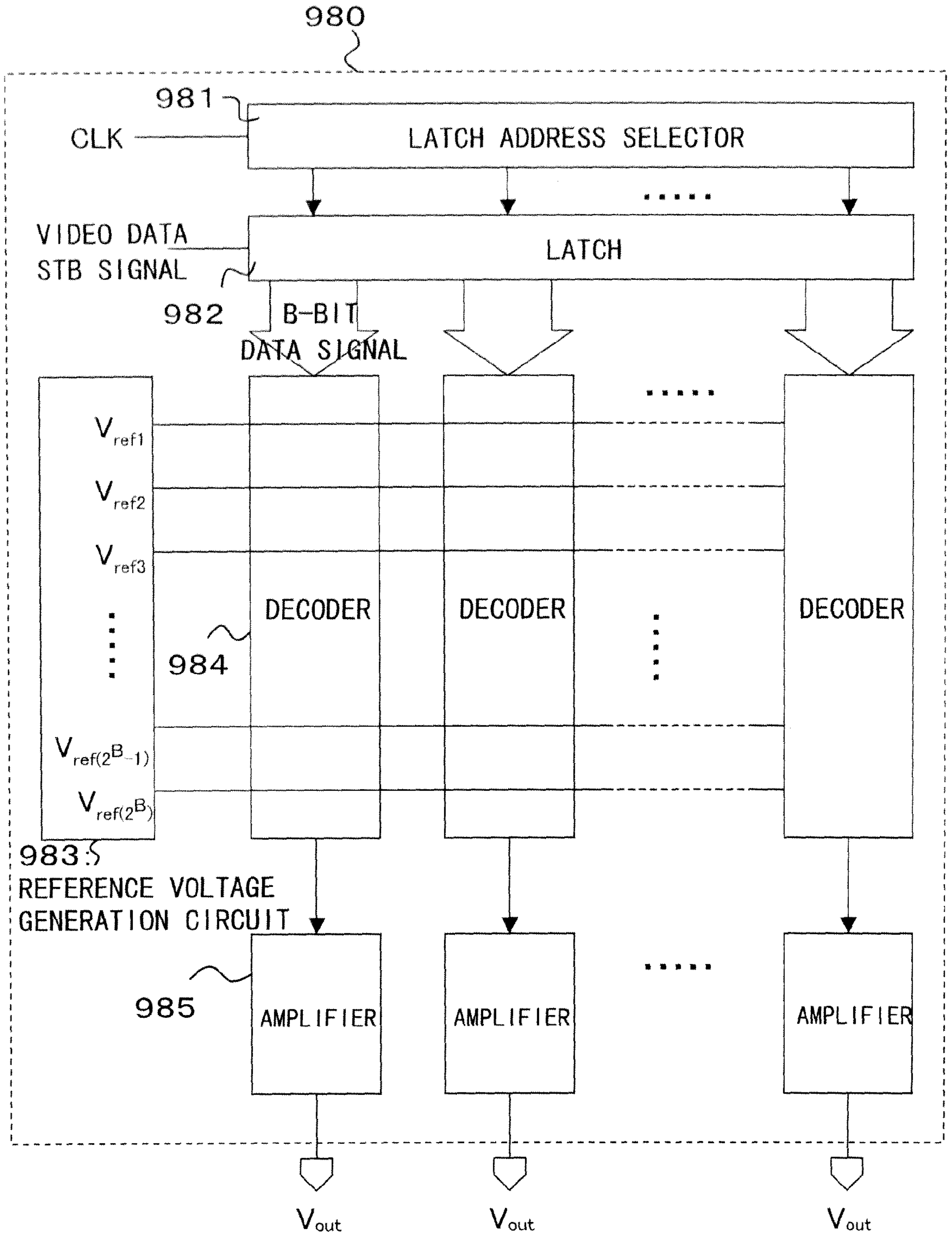
FIG. 26 RELATED ART
Figure 27:
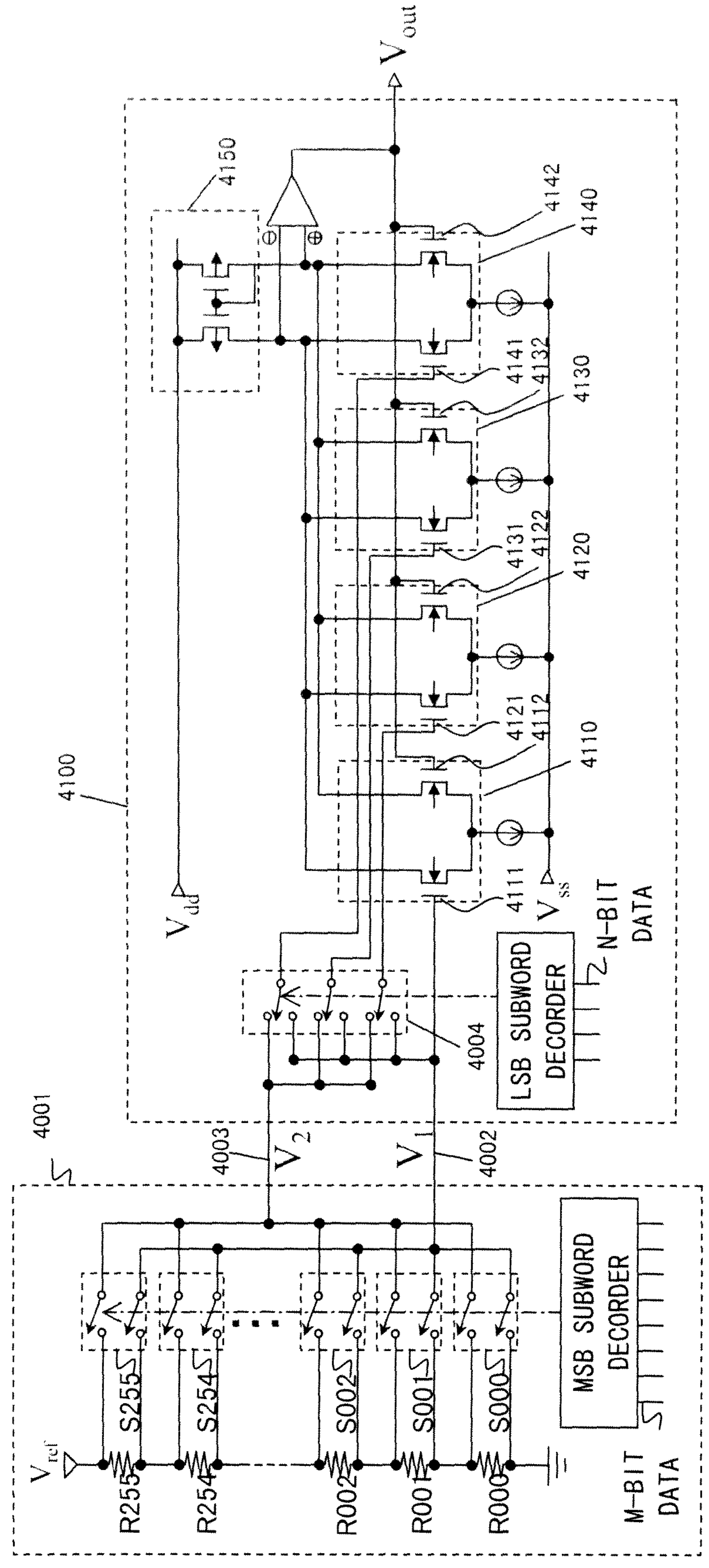
FIG. 27 RELATED ART
Figure 28:
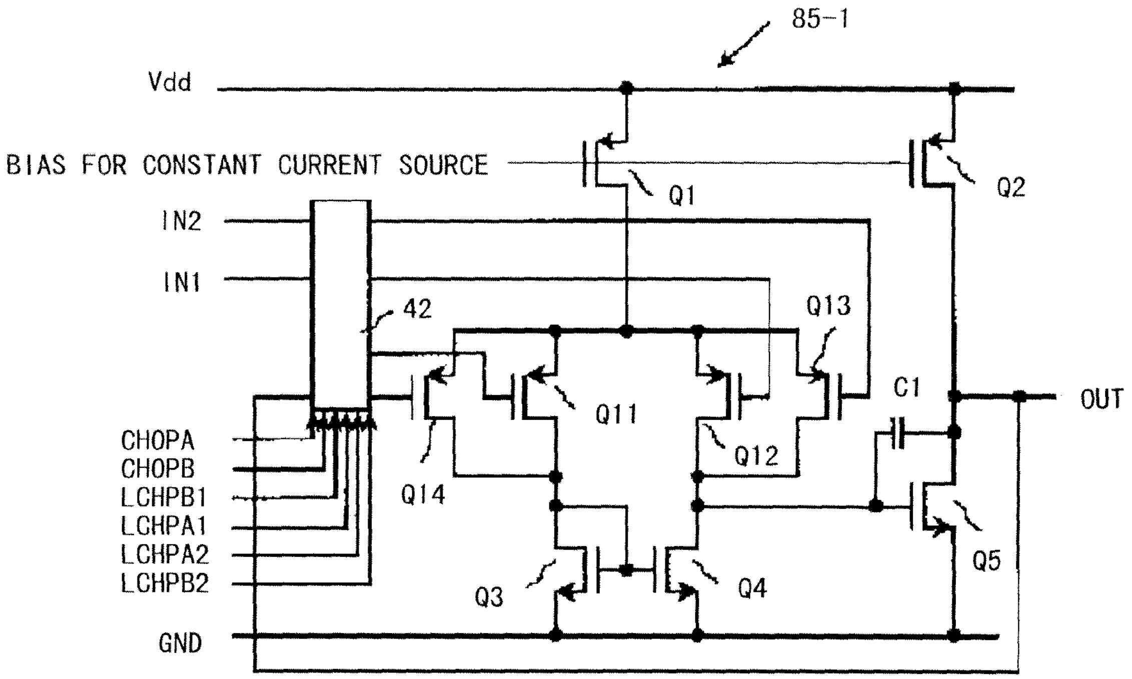
FIG. 28 RELATED ART

FIGS. 7A, 7B, and 7C are graphs plotting output errors of the operation unit in the first embodiment of the present invention and average output errors when connection switching is performed;

FIGS. 8A, 8B, and 8C are graphs plotting DNLs of the operation unit in the first embodiment of the present invention and average DNLs when the connection switching is performed;

FIG. 9 is a diagram showing a configuration example of a connection switch in the first embodiment of the present invention;

FIG. 10 is a diagram showing a configuration example in which the connection switch and a polarity switch in the first embodiment of the present invention are synthesized;

FIG. 11 is a diagram showing a configuration of an output circuit in a second embodiment of the present invention;

FIG. 12 is a diagram showing a configuration of a digital-to-analog circuit (DAC) in the second embodiment of the present invention;

FIG. 13 is a table showing relationships between bit data and outputs of a selection circuit in the second embodiment of the present invention;

FIG. 14 is a graph showing a relationship between an output voltage of the selection circuit for each gray scale and an output voltage of an operation unit in the second embodiment of the present invention;

FIG. 15 is a diagram showing a configuration example of a decoder in the second embodiment of the present invention;

FIG. 16 is a diagram showing a configuration example of the operation unit in the second embodiment of the present invention;

FIGS. 17A, 17B, and 17C are graphs plotting output errors of the operation unit in the second embodiment of the present invention and average output errors when connection switching is performed;

FIGS. 18A, 18B, and 8C are graphs plotting DNLs of the operation unit in the second embodiment of the present invention and average DNLs when the connection switching is performed;

FIG. 19 is a diagram showing a configuration example of a connection switch in the second embodiment of the present invention;

FIG. 20 is a diagram showing another configuration example of the connection switch in the second embodiment of the present invention;

FIG. 21 is a diagram showing a configuration example in which the connection switch and a polarity switch in the second embodiment of the present invention are synthesized;

FIG. 22 is a diagram showing another configuration example in which the connection switch and the polarity switch in the second embodiment of the present invention are synthesized;

FIG. 23 is a diagram showing a configuration example when the present invention has been applied to a data driver;

FIG. 24 is a diagram showing a configuration example when the data driver utilizing the present invention has been applied to an active matrix type liquid crystal display device;

FIG. 25 is a diagram showing a configuration of the active matrix type liquid crystal display device;

FIG. 26 is a diagram showing a conventional data driver;

FIG. 27 is a diagram showing a configuration of a DAC described in Patent Document 1; and FIG. 28 is a diagram showing a configuration of a differential amplifier described in Patent Document 2.

PREFERRED MODES OF THE INVENTION

Figure 1:
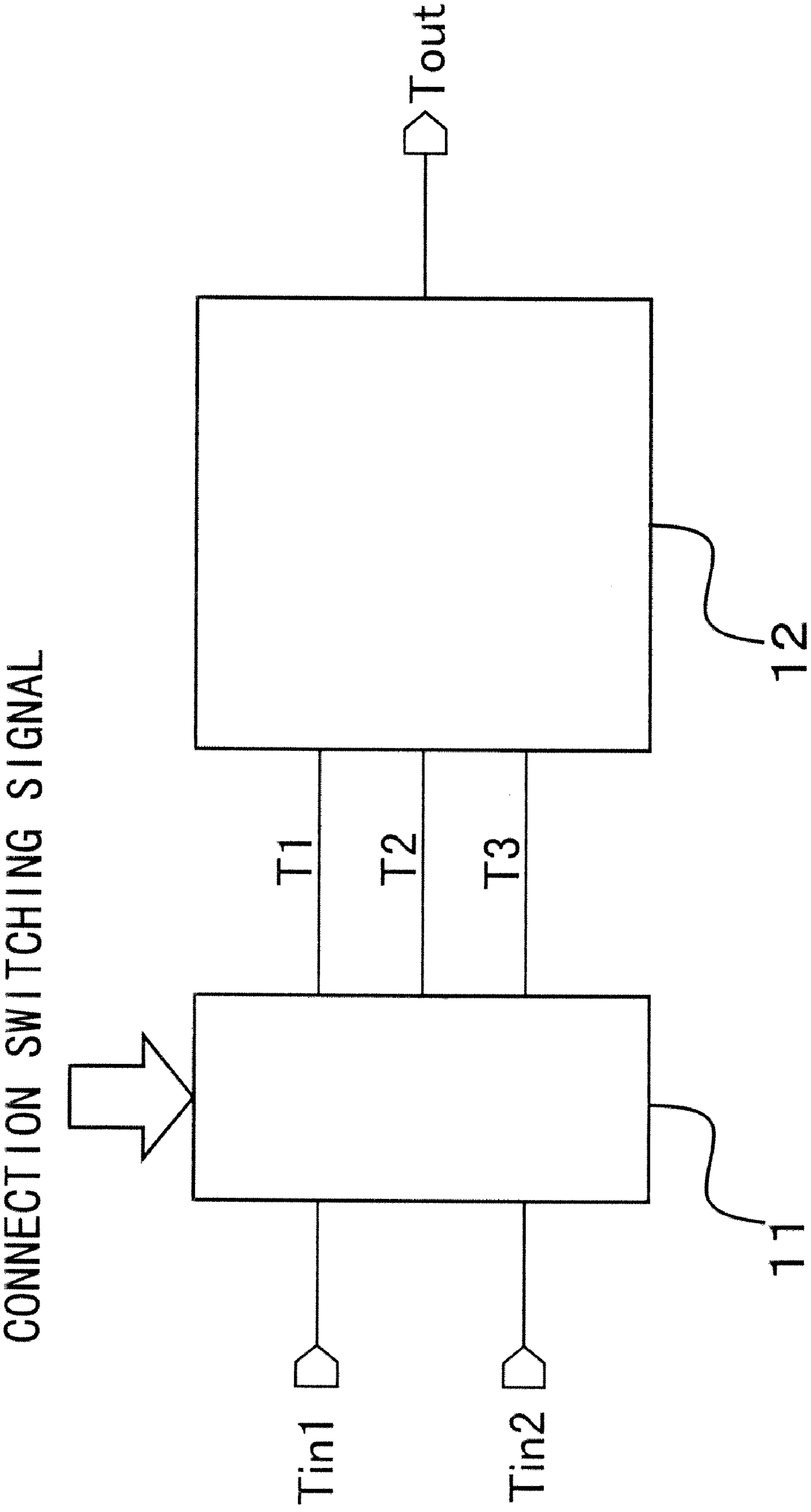
FIG. 1 is a diagram showing a configuration of an output circuit in a first embodiment of the present invention.

The preferred modes of the present invention will be described with reference to the drawings. FIG. 1 is a diagram showing a configuration of an embodiment of the present invention. Referring to FIG. 1, a connection switch 11 receives a first voltage V1 and a second voltage V2 from a terminal Tin1 and a terminal Tin2, respectively. According to a connection switching signal, a connection state between each of the terminals Tin1 and Tin2 to which the voltages V1 and V2 are input, respectively, and each of intermediate terminals T1, T2, and T3 is switched. Then, the voltage V1 or V2 is selected and output to each of the intermediate terminals T1, T2, and T3, including selection of the same voltage for a plurality of the intermediate terminals to a terminal Tout.

A operation unit 12 outputs a voltage obtained by averaging voltages V(T1), V(T2), and V(T3) supplied to the intermediate terminals T1, T2, and T3, respectively, to the output terminal Tout.

Then, by switching the connection switching signal by a predetermined time, voltages output from the operation unit 12 in the respective connection states are time averaged.

The connection switch 11 can also switch only positions of the intermediate terminals to which the voltages V1 and V2 are assigned, with the ratio of the number of the voltages V1 and V2 assigned to the intermediate terminals T1, T2, and T3, respectively, maintained at the ratio of 1:2.

In this case, it is ideal that the same voltage should be output in any connection state. However, actually, an output voltage of the operation unit 12 is slightly deviated from an expected value due to manufacturing variations of transistors.

However, by performing an operation of switching an input state of the operation unit 12 by the predetermined time, an error is averaged over the time. The error caused by device variations of the operation unit 12 can be thereby effectively reduced.

In the following examples, in particular, configurations, operations, and an error reduction effect in a case where two or three input voltages are used will be described in detail.

A first example of the present invention will be described with reference to FIG. 1. The connection switch 11 receives the first voltage V1 and the second voltage V2 from the terminal Tin1 and the terminal Tin2, respectively. Responsive to the connection switching signal, a connection state between each of the terminals Tin1 and Tin2 to which the voltages V1 and V2 are applied, respectively, and each of the intermediate terminals T1, T2, and T3 is switched. Then, the connection switch 11 selects and outputs the voltage V1 or V2 to each of the intermediate terminals T1, T2, and T3, including selection of the same voltage for a plurality of the intermediate terminals.

The connection switch 11 performs switching between a first connection state and a second connection state responsive to the connection switching signal.

In the first connection state, the connection switch 11 outputs the voltage V1 to the intermediate terminal T1, and outputs the voltage V2 to the intermediate terminals T2 and T3. (T1, T2, T3)=(V1, V2, V2)

In the second connection state, the connection switch 11 outputs the voltage V1 to the intermediate terminal T3, and outputs the voltage V2 is output to the intermediate terminals T2 and T1. (T1, T2, T3)=(V2, V2, V1).

The operation unit 12 outputs to the output terminal Tout an average voltage of the voltages V(T1), V(T2), and V(T3) supplied to the intermediate terminals T1, T2, and T3, respectively.

One of the voltages V(T1), V(T2), and V(T3) becomes the voltage V1 and two of the voltages V(T1), V(T2), and V(T3) become the voltages V2 by the connection switch 11. An output voltage Vout output to the output terminal Tout is therefore given by the following expression (1):

$$V_{out} = \frac{1 - V_1 + 2 - V_2}{3} \tag{1}$$

That is, the voltage obtained by taking weighted average of the voltages V1 and V2 at a ratio of 1:2 is output.

Further, using this connection switch and this operation unit, a DAC (a digital-to-analog converter) can be formed.

Figure 2:
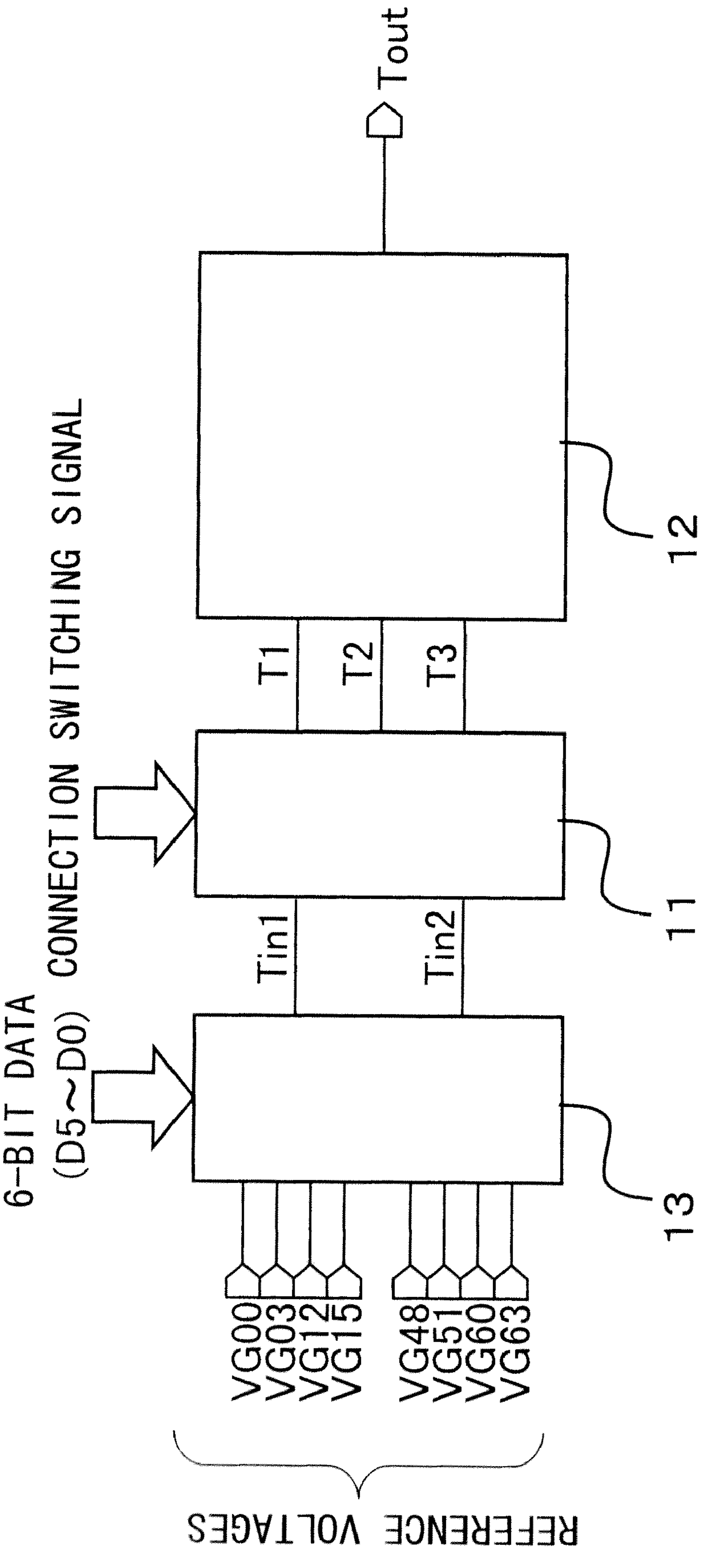
FIG. 2 is a diagram showing a configuration of a digital-to-analog converter circuit (DAC) in the first embodiment of the present invention.

FIG. 2 is a diagram showing a configuration of a 6 bit-DAC in this example. A selection circuit 13 selects two voltages inclusive of the two voltages that may be identical from among eight reference voltages according to 6-bit data and assigns the two voltages to the terminals Tin1 and Tin2, respectively. Since the connection switch 11 and the operation unit 12 in FIG. 2 have the same configurations as those in FIG. 1, descriptions of the connection switch 11 and the operation unit 12 will be omitted.

Figure 4:
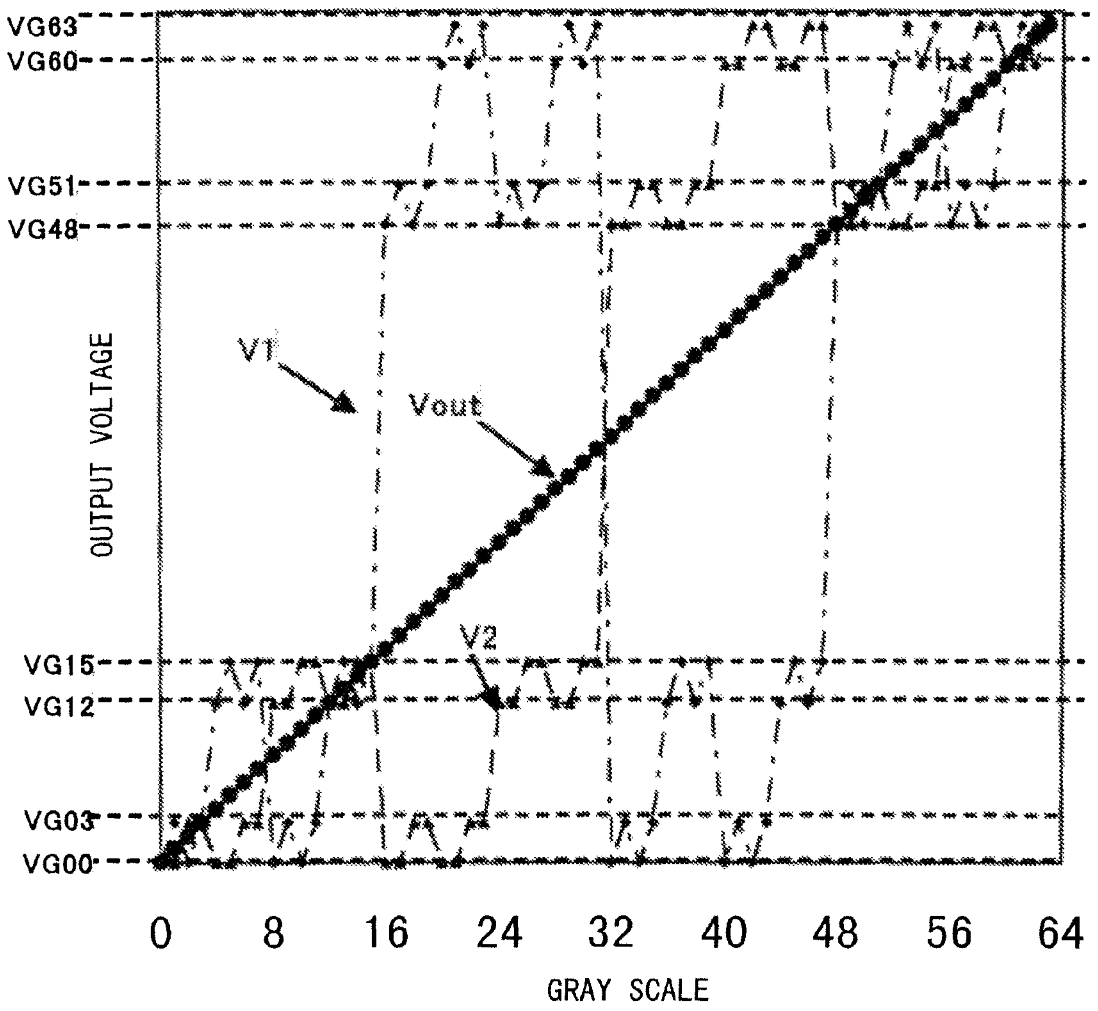
FIG. 4 is a graph showing a relationship between an output voltage of the selection circuit for each gray scale and an output voltage of an operation unit in the first embodiment of the present invention.

Among equally spaced voltages of 64 levels (corresponding to six bits), first, fourth, thirteenth, sixteenth, forty-ninth, fifty-second, sixty-first, and sixty-fourth voltages (these voltage being represented by VG00, VG03, VG12, VG15, VG48, VG51, VG60, and VG63, respectively) are employed as eight reference voltages. The selection circuit 13 selects the voltages V1 and V2 supplied to the terminals Tin1 and Tin2, respectively, according to FIG. 3. That is, linear output voltages of 64 levels from 0th gray scale corresponding to 6-bit data (D5, D4, D3, D2, D1, D0)=(0, 0, 0, 0, 0, 0) to 63th gray scale corresponding to (D5, D4, D3, D2, D1, D0)=(1, 1, 1, 1, 1, 1) can be obtained. FIG. 4 is a graph showing a 64 gray scale-output voltage characteristic.

Figure 5:
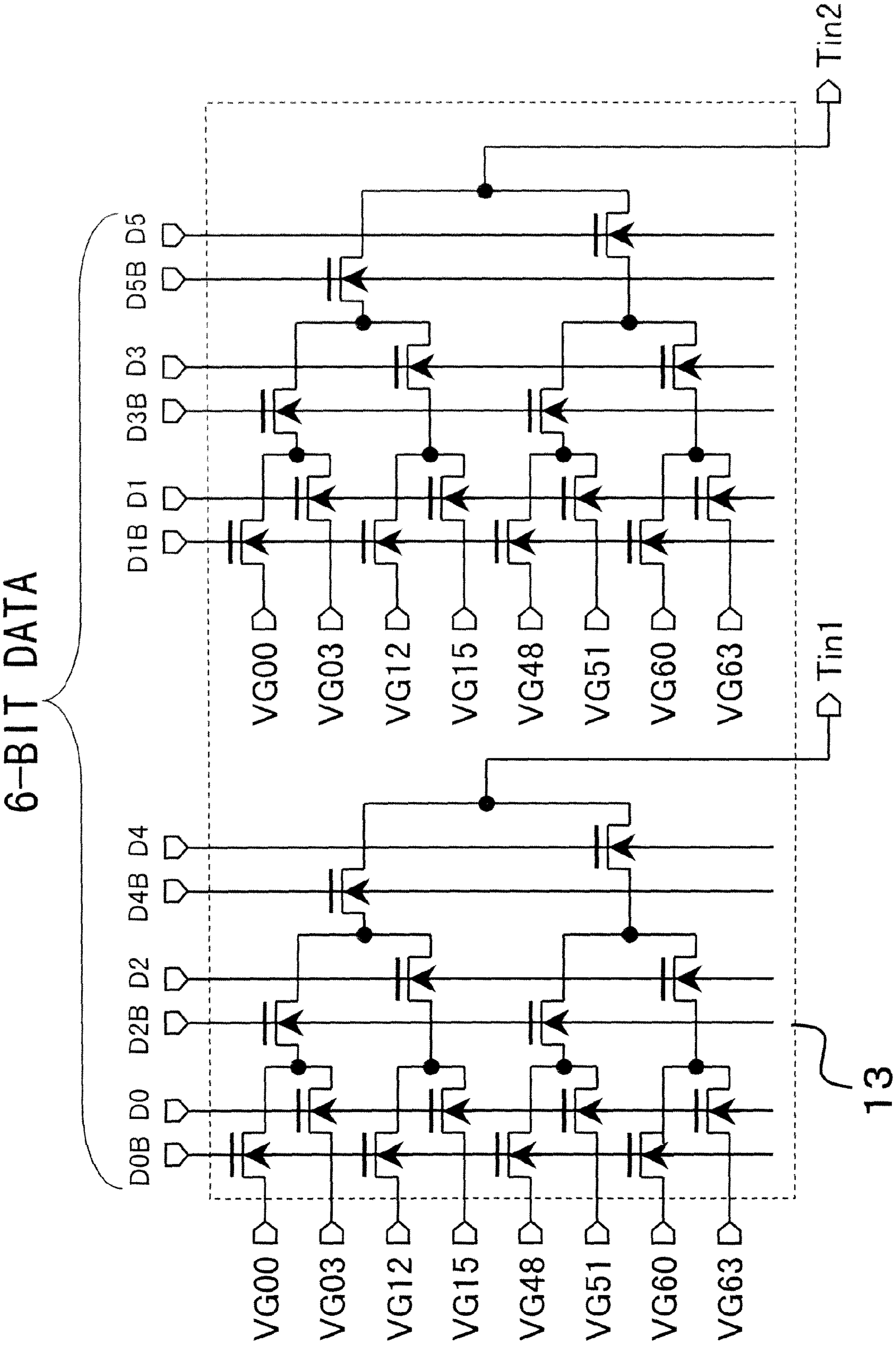
FIG. 5 is a diagram showing a configuration example of a decoder in the first embodiment of the present invention.

As an example of the selection circuit 13 in this case, a configuration as shown in FIG. 5 is employed. Three branch stages, each of which is branched into two signal paths, are provided from the terminal Tin1 to obtain eight branched signal paths. Then, switches are provided in each of the branch stages, and selection of one of the voltages VG00, VG03, VG12, VG15, VG15, VG48, VG51, VG60, and VG63 is performed. In each of the branch stages, a switch for one of complementary signals D0B and D0, D2B and D2, and D4B and D4 connected to a signal at a high level is turned on. Three branch stages, each of which is branched into two signal paths, are provided from the terminal Tin2, and selection of one of the voltages VG00, VG03, VG12, VG15, VG48, VG51, VG60, and VG63 is performed. In each of the branch stages, a switch connected to one of complementary signals D1B and D1, D3B and D3, and D5B and D5 connected to a signal at the high level is turned on. When (D0, D1, D2, D3, D4, D5)=(0, 0, 0, 0, 0, 0), for example, the same voltage VG00 is selected for the terminals Tin1 and Tin2. When (D0, D1, D2, D3, D4, D5=(1, 0, 0, 0, 0, 0), the voltages VG03 and VG00 are selected for the terminals Tin1 and Tin2, respectively.

With the above described selection circuit 13 and the operation unit 12, $8^2$=64 voltages from among the eight reference voltages can be output to the output terminal Tout of the operation unit.

Figure 6:
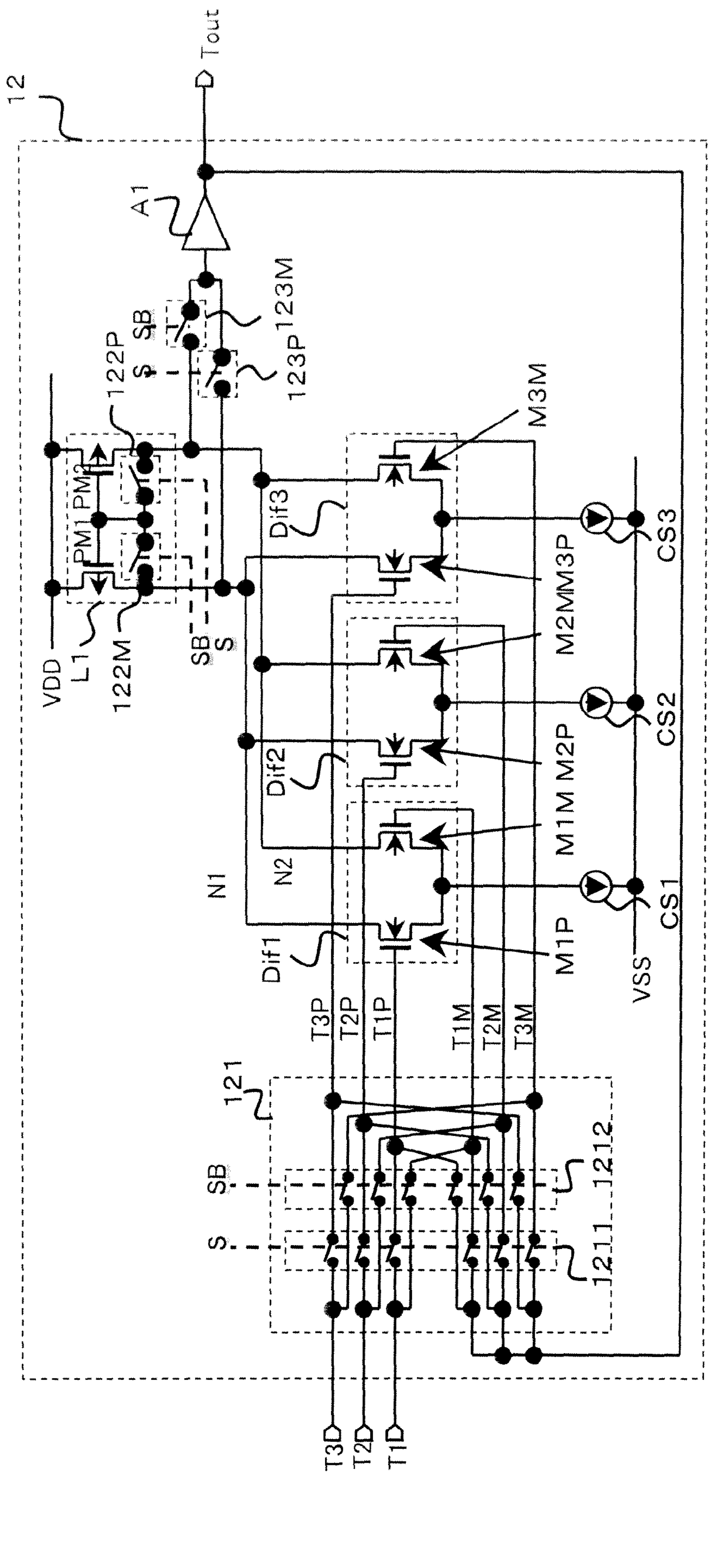
FIG. 6 is a diagram showing a configuration example of the operation unit in the first embodiment of the present invention.

FIG. 6 is a diagram showing an example of a configuration of the operation unit 12. Referring to FIG. 6, this operation unit 12 includes a first differential pair Dif1, a second differential pair Dif2, a third differential pair Dif3, the output terminal Tout, a first current source CS1, a second current source CS2, and a third current source CS3 that supply currents to the first, second, and third differential pairs, respectively, and a load circuit L1 connected in common to output pairs of the first differential pair Dif1, second differential pair Dif2, and third differential pair Dif3.

First outputs (drains of transistors M1P, M2P, and M3P) of the respective output pairs of the first differential pair Dif1, second differential pair Dif2, and third differential pair Dif3 are connected in common to a first connection node N1. Second outputs (drains of transistors M1M, M2M, and M3M) of the respective output pairs of the first differential pair Dif1, second differential pair Dif2, and third differential pair Dif3 are connected in common to a second connection node N2.

The first connection node N1 is connected to a drain of a P-channel transistor PM1 that constitutes the load circuit L1. The second connection node N2 is connected to a drain of a P-channel transistor PM2 that constitutes the load circuit L1. Gates of the P-channel transistors PM1 and PM2 are coupled together, and sources of the P-channel transistors PM1 and PM2 are connected in common to a power supply VDD. A switch 122M is connected between a gate of the P-channel transistor PM1 and the drain of the P-channel transistor PM1. A switch 122P is connected between a gate of the P-channel transistor PM2 and the drain of the P-channel transistor PM2. The switch 122P is turned on when a control signal S is high, and the switch 122M is turned on when the control signal S is low.

The operation unit 12 includes switching circuits 123P and 123M that perform switching between connection of the first connection node N1 to an input terminal of an amplification stage A1 and connection of the second connection node N2 to the input terminal of the amplification stage A1, responsive to the control signal S and a control signal SB.

A polarity switch (a plus/minus switch) 121 performs interchange between non-inverting inputs (+) and inverting inputs (−) of the differential pairs. The polarity switch 121 includes switches that receive signals at the internal terminals T1, T2, and T3, respectively, and an output of the amplification stage A1, and switch connections to terminals T1P, T2P, T3P, T1M, T2M, and T3M, respectively. The terminals T1P, T2P, and T3P are connected to first inputs (gates of the transistors M1P, M2P, and M3P) of the first differential pair Dif1, second differential pair Dif2, and third pair Dif3, respectively. The terminals T1M, T2M, and T3M are connected to second inputs (gates of the transistors M1M, M2M, and M3M) of the first differential pair Dif1, second differential pair Dif2, and third differential pair Dif3, respectively.

When the control signal S is high, a switch 1211 is turned on, and a switch 1212 is turned off. The intermediate terminals T1, T2, and T3 are connected to the terminals T1P, T2P, and T3P, respectively, and the output terminal Tout of the amplification stage A1 is connected to the terminals T1M, T2M, and T3M, respectively.

The intermediate terminals T1, T2, and T3 are connected to the first outputs (gates of the transistors M1P, M2P, M3P) of the first differential pair Dif1, second differential pair Dif2, and third differential pair Dif3, respectively. The output terminal Tout is connected to the second inputs (gates of the transistors M1M, M2M, and M3M).

When the control signal S is low, the switch 1212 is turned on, and the switch 1211 is turned off. The intermediate terminals T1, T2, and T3 are connected to the terminals T1M, T2M, and T3M, respectively, and the output terminal Tout of the amplification stage A1 is connected to the terminals T1P, T2P, and T3P, respectively. The intermediate terminals T1, T2, and T3 are connected to the second inputs (gates of the transistors M1M, M2M, M3M) of the first differential pair Dif1, second differential pair Dif2, and third differential pair Dif3, respectively. The output terminal Tout is connected to the first inputs (gates of the transistors M1P, M2P, and M3P).

When sizes of the transistors M1P to M3P and the transistors M1M to M3M that constitute the differential pairs Dif1, Dif2, and Dif3 are equal to one another, when current values of the current sources CS1 to CS3 are set to be equal to one another, and when voltages (of approximately 0.2V) input to the terminals T1 to T3, respectively, are close to one another, an output voltage becomes a value given by Expression (1).

Further, using the polarity switch 121, and the switches 122P, 122M, 123P, and 123M, non-inverting inputs (+) and inverting inputs (−) of a differential amplifier circuit can be interchanged.

That is, when the switches 1211 of the polarity switch 121 are turned on and the switches 1212 of the polarity switch 121 are turned off, and when the switches 122P and 123P are turned on and the switches 122M and 123M are turned off, the gates of the transistors M1P, M2P, and M3P of the differential pairs Dif1 to Dif3 become the non-inverting inputs (+) and the gates of the transistors M1M, M2M, and M3M of the differential pairs Dif1 to Dif3 become the inverting inputs (−).

Conversely, when the switches 1212 of the polarity switch 121 are turned on and the switches 1211 of the polarity switch 121 are turned off, and when the switches 122M and 123M are turned on and the switches 122P and 123P are turned off, the gates of the transistors M1M, M2M, and M3M of the differential pairs Dif1 to Dif3 become the non-inverting inputs (+) and the gates of the transistors M1P, M2P, and M3P of the differential pairs Dif1 to Dif3 become the inverting inputs (−).

When the operation unit 12 is an ideal operation unit, the voltage expressed by Expression (1) is output to the output terminal Tout, irrespective of a connecting state.

Actually, however, an operation error or an offset caused by manufacturing variations (mismatching) among transistors in the operation unit 12 often occurs. When the operation unit 12 is employed for the DAC as shown in FIG. 2, and when the variations are large, in particular, gray scale inversion or a gray scale jump may also occur.

In order to exhibit an effect achieved by the present invention, maximum and minimum possible values of a time averaging of offset voltages were shown in FIGS. 7A-7C, and maximum and minimum possible values of a time averaging of adjacent gray scale voltages (DNL: Differential Non-Linearity) were shown in FIGS. 8A-8C. These operations were performed under a condition in which transistor sizes of the differential pairs Dif1 to Dif3, current sources CS1 to CS3, and load circuit L1 of the operation unit 12 in FIG. 6 were varied randomly, and by application of the present invention, the first connection state and the second connection state were temporally switched.

DNL is a value expressing the linearity of the DAC. DNL is the difference between changes of a DAC's actual analog output relative to a single step change (1LSB). The more DNL is close to zero, it shows that the linearity is more satisfactory (and is close to an ideal straight line). When the DNL exceeds one, it shows that the gray scale jump occurs between adjacent gray scales. When the DNL becomes equal to or less than −1, it shows that gray scale inversion occurs between the adjacent gray scales.

As an object of comparison for showing the effect of the present invention, the time averaging when no interchange among the differential pairs was made and only the non-inverting inputs (+) and the inverting inputs (−) of the differential pairs were switched was also shown in each of FIGS. 7A-7C and 8A-8C.

Referring to FIGS. 7A-7C and 8A-8C, it can be seen that the offset voltage and the DNL have been improved more than in a state A (a connection state 1) where no switching was performed, and that the DNL between 31th gray scale and 32th gray scale in particular has been greatly improved.

It can be seen that in an example of the comparison, an offset voltage has been improved by switching between the non-inverting inputs and the inverting inputs of the differential pairs (refer to FIG. 7C), but no improvement has been made on the DNL (refer to FIG. 8C).

This has shown that, by applying the present invention, the DNL as well as the offset voltage can be improved.

Next, a configuration of the connection switch 11 in this example will be described.

In the first connection state, the connection switch 11 outputs the voltage V1 to the intermediate terminal T1 and outputs the voltage V2 to the intermediate terminals T2 and T3, among the intermediate terminals T1 to T3.

In the second connection state, the connection switch 11 outputs the voltage V1 to the intermediate terminal T3 and outputs the voltage V2 to the intermediate terminals T2 and T1, among the intermediate terminals T1 to T3.

Accordingly, more specifically, the terminal Tin1 to which the voltage V1 is input and the intermediate terminal T1 are connected by a switch controlled by a connection switching signal (CP), and the terminal Tin2 to which the voltage V2 is input and the intermediate terminal T3 are connected by a switch controlled by the connection switching signal (CP).

The terminal Tin1 to which the voltage V1 is input and the intermediate terminal T3 are connected by a switch controlled by a complementary signal (CPB) of the connection switching signal, and the terminal Tin2 to which the voltage V2 is input and the intermediate terminal T1 are connected by a switch controlled by the complementary signal (CPB) of the connection switching signal.

The intermediate terminal T2 should have a configuration in which the voltage V2 is output therefrom irrespective of a state of the connection switching signal. The configuration that meets the specification as described above becomes the one as shown in FIG. 9, for example. A switch SW11 is provided between the terminal Tin1 and the terminal T1. A switch SW13 is provided between the terminal Tin1 and the terminal T3. A switch SW21 is provided between the terminal Tin2 and the terminal T1. A switch 23 is provided between the terminal Tin2 and the terminal T3. Then, the terminal Tin2 is directly coupled to the terminal T2. The switches SW11 and SW23 constitute switches 1101. Turning on and off of the switches SW11 and SW23 is controlled by the connection switching signal CP. The switches SW21 and SW13 constitute switches 1102. Turning on and off of the switches SW21 and SW13 is controlled by the connection switching signal CPB (complementary signal of the signal CP).

Referring to FIG. 9, in the first connection state, the switches 1101 are turned on, and the switches 1102 are turned off. The voltage V1 is thereby output to the intermediate terminal T1, and the voltage V2 is thereby output to the intermediate terminals T2 and T3. In the second connection state, the switches 1102 are turned on, and the switches 1101 are turned off. The voltage V1 is thereby output to the intermediate terminal T3, and the voltage V2 is output to the intermediate terminals T2 and T1. Though the voltage V2 and the intermediate terminal T2 are short-circuited, the voltage V2 should be output to the intermediate terminal T2, irrespective to the connection state.

The switches 1101 and the switches 1102 in FIG. 9 can be formed of MOS transistors. That is, one of a source and a drain of each MOS transistor should be connected to the terminal (Tin1 or Tin2) to which the voltage V1 (or V2) is input, the other of the source and the drain of each MOS transistor should be connected to the intermediate terminal (T1 or T2), and the connection switching signal (CP) or the complementary signal (CPB) of the connection switching signal should be input to a gate of each MOS transistor. When the switches are formed of N-channel transistors, the switches are turned on when the connection switching signal (CP) is high. When the connection switching signal (CP) is low, the switches are turned off. Thus, in the first connection state, the connection switching signal (CP) should be set to high, while in the second connection state, the connection switching signal (CP) should be set to low.

When the switches are formed of P-channel transistors, an on/off logic becomes the reverse of that of the N-channel transistors. Thus, in the first connection state, the connection switching signal (CP) should be set to low. In the second connection state, the connection switching signal (CP) should be set to high. Further, each switch may be formed of a transfer gate in which an N-channel transistor is combined with a P-channel transistor.

Further, the signal that controls the polarity switch 121 and the signal that controls the connection switch 11 can be made the same. In this case, the polarity switch 121 and the connection switch 11 may be combined into one connection switch.

FIG. 10 shows an example of a configuration in which the polarity switch 121 and the connection switch 11 are combined into one connection switch 11B in this example.

Referring to FIG. 10, in the first connection state, switches 1111 are turned on, and switches 1112 are turned off. The voltage V1 is thereby output to the terminal T1P, the voltage V2 is thereby output to the terminals T2P and T3P, and a voltage Tout is output to the terminals T1M, T2M, and T3M. In the second connection state, the switches 1112 are turned on, and the switches 1111 are turned off. The voltage V1 is thereby output to the terminal T3M, the voltage V2 is thereby output to the terminals T2M and T1M, and the voltage Tout is output to the terminals T1P, T2P, and T3P. As described above, the polarity switch 121 and the connection switch are configured to be combined, thereby allowing reduction of the total number of the switches.

FIG. 11 is a diagram showing a configuration of a second example of the present invention. First, second, and third voltages (V1, V2, V3) are supplied to a connection switch 11, and connection states between respective terminals to which the voltages V1, V2, and V3 are input and respective intermediate terminals T1 to T7 are switched responsive to a connection switching signal. The connection switch 11 performs selection among the voltages V1, V2, and V3 including selection of the voltages that may be identical and outputs the selected voltages to the terminals T1 to T7, respectively.

Alternatively, the connection switch 11 performs switching between a first connection state and a second connection state responsive to the connection switching signal, and outputs the voltage V1 to the terminal T1, outputs the voltage V2 to the terminals T2 and T3, and outputs the voltage V3 to the terminals T4, T5, T6, and T7, among the terminals T1 to T7, in the first connection state.

In the second connection state, the connection switch 11 outputs the voltage V1 to the terminal T7, outputs the voltage V2 to the terminals T6 and T5, and outputs the voltage V3 to the terminals T4, T3, T2, and T1, among the terminals T1 to T7.

A operation unit 12 outputs an average voltage of seven voltages V(T1) to V(T7) supplied to the terminals T1 to T7, and outputs the average voltage to an output terminal Tout.

One of the voltages V(T1) to V(T7) becomes the voltage V1, two of the voltages V(T1) to V(T7) become the voltages V2, and four of the voltages V(T1) to V(T7) become the voltages V3, by the connection switch 11. An output voltage Vout is as follows:

$$V_{out} = \frac{1-V_1+2-V_2+4-V_3}{7} \quad (2)$$

That is, the voltage obtained by taking weighted average of the voltages V1, V2, and V3 at a ratio of 1:2:4 is output.

Further, using this connection switch 11 and the operation unit 12, a DAC (digital-to-analog converter) can be composed.

FIG. 12 is a diagram showing a concept about a configuration of a 6-Bit DAC in this example. A selection circuit 13 has a function of selecting three voltages that may be identical from among four reference voltages according to 6-bit data, and assigning the selected three voltages to terminals Tin1 to Tin3.

Among voltages of 64 levels (corresponding to six bits) equally spaced, first, eighth, fifty-seventh, sixty-fourth, voltages (these voltages being represented by voltages VG00, VG07, VG56, and VG63, respectively) are set to the four reference voltages. Then, when the selection circuit 13 selects the voltages V1 and V3 supplied to the terminals Tin1 and Tin3, respectively according to a table shown in FIG. 13, linear output voltages of the 64 levels from 0th gray scale corresponding to 6-bit data (D5, D4, D3, D2, D1, D0)=(0, 0, 0, 0, 0, 0) to 63th gray scale corresponding to 6-bit data (D5, D4, D3, D2, D1, D0)=(1, 1, 1, 1, 1, 1) can be obtained (as shown in FIG. 14). FIG. 13 shows a list of respective bit data of gray scales from 0th gray scale to 63th gray scale and the outputs V1, V2, and V3 of the selection circuit.

As an example, the selection circuit 13 is configured as shown in FIG. 15. One of the voltages VG00, VG07, VG56, and VG63 is output to the terminal Tin1 via switches that are turned on according to the bit data D0 and D3 and complementary signals of the bit data D0 and D3. One of the voltages VG00, VG07, VG56, and VG63 is output to the terminal Tin2 according to the bit data D1 and D4 and complementary signals of the bit data D1 and D4. One of the voltages VG00, VG07, VG56, and VG63 is output to the terminal Tin3 according to the bit data D2 and D5 and complementary signals of the bit data D2 and D5. By using the selection circuit 13 and the operation unit 12, $4^3$=64 voltages from among the four reference voltages can be output to the output terminal Tout of the operation unit (refer to FIG. 14).

FIG. 16 is a diagram showing a configuration of the operation unit 12 in this example. Referring to FIG. 16, the operation unit 12 includes first to seventh differential pairs Dif1 to Dif7, the output terminal Tout, first to seventh current sources CS1 to CS7 that supply currents to the first to seventh differential pairs Dif1 to Dif7, respectively, and a load circuit L1 connected in common to output pairs of the first to seventh differential pairs Dif1 to Dif7.

First outputs of the respective output pairs of the first to seventh differential pairs Dif1 to Dif7 are connected in common to a first connection node N1. Second outputs of the first to seventh differential pairs Dif1 to Dif7 are connected in common to a second connection node N2.

The first connection node N1 is connected to a drain of a P-channel transistor PM1 that forms the load circuit 11, and the second connection node N2 is connected to a drain of a P-channel transistor PM2 that forms the load circuit L1. Gates of the P-channel transistors PM1 and PM2 are connected, and sources of the P-channel transistors PM1 and PM2 are connected to a power supply. A switch 122M is connected between the drain of the P-channel transistor PM1 and a gate of the P-channel transistor PM1. A switch 122P is connected between the drain of the P-channel transistor PM2 and a gate of the P-channel transistor PM2. The switch 122P is turned on when a control signal S is high. The switch 122M is turned on when the control signal S is low.

The operation unit 12 includes a switching circuit 123P and a switching circuit 123M that perform switching between connection of the first connection node N1 to an input terminal of an amplification stage A1 and connection of the second connection node N2 to the input terminal of the amplification stage A1.

A polarity switch 121 switches connection of the intermediate terminals T1 to T7 of the connection switch 11 to first inputs of the first to seventh differential pairs (gates of transistors M1P, M2P, . . . and M7P) and connection of the output terminal Tout of a differential amplifier to second inputs of the first to seventh differential pairs (gates of transistors M1M, M2M, . . . , and M7M), or connection of the output terminal Tout of the differential amplifier to the first inputs of the first to seventh differential pairs (gates of the transistors M1P, M2P, . . . , M7P) and connection of the intermediate terminals T1 to T7 of the connection switch 11 to the second inputs of the first to seventh differential pairs (gates of the transistors M1M, M2M, . . . , M7M), responsive to the control signal S and a complementary signal SB of the control signal S.

The configuration in FIG. 16 is the configuration in which the number of the differential pairs has been increased from three to seven in the operation unit 12 shown in FIG. 6.

When each size of the transistors M1P to M7P that constitute the differential pairs Dif1 to Dif7 is mutually equal to each size of the transistors M1M to M7M that constitute the differential pairs Dif1 to Dif7 in this operation unit 12 (differential amplifier), when respective current values of the current sources CS1 to CS7 are set to be equal to each other, and when voltages (of approximately 0.2V) supplied to the terminals T1 to T7, respectively, are close to one another, an output voltage becomes a value given by Expression (2).

Further, in the configuration in FIG. 16, using the polarity switch 121, and the switches 122P, 122M, 123P, and 123M, non-inverting inputs (+) and inverting inputs (−) of the differential pairs can be interchanged, as in the operation unit 12 in FIG. 6. Since an operation of interchanging the non-inverting inputs (+) and the inverting inputs (−) of the differential pairs is the same as that of FIG. 6, a description about the operation will be omitted.

As described in the first example, an operation error or an offset often occurs due to manufacturing variations (mismatching) among the transistors inside the operation unit 12.

Then, in order to exhibit an effect by the present invention, maximum and minimum possible values of a time averaging of offset voltages when transistor sizes of the differential pairs Dif1 to Dif7 of the operation unit 12 in FIG. 16, current sources CS1 to CS7, and load circuit L1 were varied randomly, and by applying the present invention, switching between the first connection state and the second connection state was temporally made, for output, were shown in FIGS. 17A-17C. Then, maximum and minimum possible values of a time averaging of adjacent gray scale voltages (DNL) were shown in FIGS. 18A-18C.

Figure 18C:
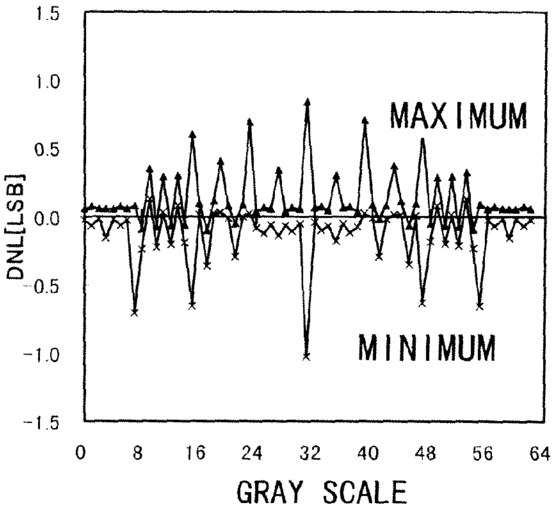

As an object of comparison for showing the effect of the present invention, the time averaging when no interchange among the differential pairs was made and only the non-inverting inputs (+) and the inverting inputs (−) of the differential pairs were switched was also shown in each of FIGS. 17C and 18C.

Referring to FIGS. 17A-17C and 18A-18C, it can be seen that the offset voltage and the DNL have been improved more than in the state (connection state 1)(A) where no switching was performed, and that the DNL between 31th gray scale and 32th gray scale in particular has been greatly improved.

It can be seen that in the example of the comparison in each of FIGS. 17C and 18C, the offset voltage has been improved by switching between the non-inverting inputs and inverting inputs of the differential pairs, but no improvement has been made on the DNL.

This has shown that, by applying the present invention, the DNL as well as the offset voltage can be improved.

Next, a specific configuration of the connection switch 11 in this example will be described.

In the first connection state, the connection switch 11 outputs the voltage V1 to the terminal T1, outputs the voltage V2 to the terminals T2 and T3, and outputs the voltage V3 to the terminals T4, T5, T6, and T7, among the intermediate terminals T1 to T7. In the second connection state, the connection switch 11 outputs the voltage V1 to the terminal T7, outputs the voltage V2 to the terminals T6 and T5, and outputs the voltage V3 to the terminals T4, T3, T2, and T1, among the intermediate terminals T1 to T7.

Accordingly, the terminal Tin1 to which the voltage V1 is input and the terminal T1, the terminal Tin2 to which the voltage V2 is input and each of the terminals T2 and T3, and the terminal Tin3 to which the voltage V3 is input and each of the terminals T5 to T7 are connected by switches controlled by the connection switching signal (CP), respectively. The terminal Tin1 to which the voltage V1 is input and the terminal T7, the terminal Tin2 to which the voltage V2 is input and each of the terminals T5 and T6, the terminal Tin3 to which the voltage V3 is input and each of the terminals T1 to T3 are connected by switches controlled by the complementary signal of the connection switching signal, respectively. The voltage V3 is output to the terminal T4 irrespective of the connection switching signal.

The configuration of the connection switch 11 as described above becomes the one as shown in FIG. 19, for example. Referring to FIG. 19, in the first connection state, switches 1103 composed of switches SW11, SW22, SW23, SW35, SW36, and SW37 are turned on, and switches 1104 composed of switches SW31, SW32, SW33, SW25, SW26, and SW17 are turned off. As a result, the voltage V1 is thereby output to the terminal T1, the voltage V2 is thereby output to the terminals T2 and T3, and the voltage V3 is output to the terminals T4, T5, T6, and T7. Meanwhile, a switch Swab indicates the switch connected between a terminal Tina (in which a is one of 1, 2, and 3) and a terminal Tb (in which b is one of 1 to 7).

In the second connection state, the switches 1104 are turned on, and the switches 1103 are turned off. As a result, the voltage V1 is thereby output to the terminal T7, the voltage V2 is output to the terminals 6 and 5, and the voltage V3 is output to the terminals T4, T3, T2, and T1.

Though the voltage V3 and the terminal T4 are short-circuited, the voltage V3 should be output irrespective of the connection state.

In the connection switch 11 shown in FIG. 19, a plurality of switches connected to intermediate terminals to which the same voltage is output may be combined, irrespective of the connection state. For example, in the first connection state, the voltage V2 is output to both of the intermediate terminals T2 and T3. In the second connection state, the voltage V3 is output to both of the intermediate terminals T2 and T3.

Accordingly, even in both of the connection states, the same voltage is output to the intermediate terminals T2 and T3. Thus, as for the intermediate terminals T2 and T3 and the switches 1103 on/off controlled by the connection control signal CP, switches to which the voltage V2 is applied may be combined into one switch.

A configuration in which the switches are combined as described above in the connection switch 11 in FIG. 19 is shown in FIG. 20. Referring to FIG. 20, the intermediate terminals T2 and T3 in FIG. 19 are combined into one terminal (with common switches) and the intermediate terminals T5 and T6 in FIG. 19 are combined into one terminal (with common switches). In the case of the configuration shown in FIG. 20, the number of the switches can be reduced more than in the configuration in FIG. 19. Meanwhile, each switch in FIGS. 19 and 20 can be formed of an N-channel transistor or a P-channel transistor, as in the first example.

Further, when the same signal controls the polarity switch 121 and the connection switch 11, as in the first example, the polarity switch 121 and the connection switch 11 may be combined into one connection switch.

FIG. 21 shows one connection switch 11B obtained by combining the polarity switch 121 and the connection switch 11 in this example, and the number of the switches is reduced. When the connection switching signal CP is high, switches 1113 are turned on, and switches 1114 are turned off. Then, the terminal Tin1 is connected to a terminal T1P, the terminal Tin2 is connected to terminals T2P and T3P, and the terminal Tin3 is connected to terminals T4P, T5P, T6P, and T7P. The output terminal Tout is connected to terminals T1M to T7M. When the connection switching signal CP is low (when the signal CPB is high), the switches 1114 are turned on, and the switches 1113 are turned off. Then, the terminal Tin1 is connected to the terminal T7M, the terminal Tin2 is connected to the terminals T5M and T6M, and the terminal Tin3 is connected to the terminals T1M, T2M, T3M, and T4M. The output terminal Tout is connected to the terminals T1P to T7P.

In the same manner in which the configuration in FIG. 19 is modified into the configuration in FIG. 20, switches having the same input and output in the first and second connection states can be combined into one switch in the configuration in FIG. 21 as well. The configuration in FIG. 21 can be modified into a configuration in FIG. 22, for example. The terminals T2P and T3P are combined into one terminal (with common switches). The terminals T5P and T6P are combined into one terminal (with common switches). The terminals T2M and T3M are combined into one terminal (with common switches). Then, the terminals T5M and T6M are combined into one terminal (with common switches).

The above description showed examples where the present invention has been applied to two examples when the three differential pairs were used and the seven differential pairs were used. When examples in FIGS. 2 and 12 are expanded, the following description can be generally made.

That is, a DAC formed of a selection circuit that selects M voltages V1 to VM inclusive of voltages that may be identical from among 2K reference voltages, a connection switch including M terminals to which the voltages V1 to VM are input, respectively, and $(2^M-1)$ intermediate terminals T1 to $T(2^M-1)$, and an operation unit that outputs to the output terminal Tout an average voltage of voltages V(T1) to $V(T(2^M-1))$ given to the $(2^M-1)$ intermediate terminals T1 to $T(2^M-1)$, respectively, can be configured. Among the intermediate terminals T1 to $T(2^M-1)$, the connection switch outputs the voltage V1 to one of the intermediate terminals, outputs the voltage V2 to two of the intermediate terminals, outputs the voltage V3 to four of the intermediate terminals, outputs a voltage Vi (i being an integer not less than one and not more than M) to $2(^{i-1})$ of the intermediate terminals, and outputs the voltage VM to $2(^{M-1})$ of the intermediate terminals.

In this DAC, the reference voltages are set to $(1+(2^M-1)\Sigma_{i=1}{}^K(\alpha_i\times 2^{(i-1)M})$th voltages (where $\alpha_i$ to $\alpha_K$ assume one of values of 0 and 1) among voltages of $2^{KM}$ levels equally spaced. Equally spaced $2^{KM}$ output voltages are thereby obtained.

In both of the examples described in the first and second examples, the following equation holds:

the number of the intermediate terminals(such as the terminal $T1$)=(square of the number of input voltages(such as the voltage $V1$)−1

Further, it can be seen that one of the voltages V1 to V3 is always assigned to (N+1)/2 intermediate terminals of all the (N) intermediate terminals. It can be seen that when the voltage assigned to the (N+1)/2 intermediate terminals in the first connection state is represented by Vx, switching is performed in the second connection state so that the voltage assigned to one of the (N+1)/2 intermediate terminals to which the voltage Vx has been assigned in the first connection state remains to be the voltage Vx, the voltage other than the voltage Vx is assigned to remaining (N−1)/2 intermediate terminals, and the voltage Vx is assigned to (N−1)/2 intermediate terminals to which the voltage other than the voltage Vx has been assigned in the first connection state.

The voltage corresponding to the above-mentioned voltage Vx is V3 in the second example of the present invention, and the voltage V3 is assigned to (7+1)/2=4 intermediate terminals among the seven intermediate terminals T1 to T7.

Among the four intermediate terminals to which the voltage V3 has been assigned in the first connection state, the voltage V3 remains to be assigned to one of the four intermediate terminals, in the second connection state. Then, the voltage V1 is assigned to one of the three intermediate terminals, and the voltage V2 is assigned to two of the three intermediate terminals, in the second connection state. To three of the intermediate terminals to which the voltage V3 has not been assigned (to which the voltages V1 and V2 have been assigned) in the first connection state, the voltage V3 is assigned in the second connection state.

As described above, it can be easily inferred that when an algorithm for performing switching between the voltages and the intermediate terminals is expanded, the present invention can be applied to a DAC as well obtained by expanding the DACs in FIG. 2 and FIG. 12.

That is, in the first connection state, among the intermediate terminals T1 to $T(2^M-1)$, the voltage VM is assigned to $2^{(M-1)}$ of the intermediate terminals, and the voltage V1 is assigned to one of the remainder of the intermediate terminals. The voltage V2 is assigned to two of the remainder of the intermediate terminals. The voltage V3 is assigned to four of the remainder of the intermediate terminals. Then, the voltage V(M−1) is assigned to $2^{(M-2)}$ of the remainder of the intermediate terminals.

In the second connection state, among the $2^{(M-1)}$ terminals to which the voltage VM has been assigned in the first connection state, the voltage VM remains to be assigned to one of the $2^{(M-1)}$ terminals. The voltage V1 is assigned to one of the remaining $(2^{(M-1)}-1)$ intermediate terminals. The voltage V2 is assigned to two of the remaining $(2^{(M-1)}-1)$ intermediate terminals. The voltage V3 is assigned to four of the remaining $(2^{(M-1)}-1)$ intermediate terminals. The voltage V(M−1) is assigned to $2^{(M-2)}$ intermediate terminals. To all the $(2^{(M-1)}-1)$ intermediate terminals to which the voltages V1 to V(M−1) have been assigned in the first connection state, the voltage VM is assigned.

By performing the switching as described above, the present invention can be applied even in a case (where $(2^M-1)$ differential pairs are used in general) other than cases where three differential pairs are used and where seven differential pairs are used. When M is set to four, for example, the number of the intermediate terminals becomes $2^4-1=15$.

Among the intermediate terminals T1 to T15, the connection switch 11 assigns the voltage V1 to one of the intermediate terminals. The connection switch 11 assigns the voltage V2 to two of the intermediate terminals. The connection switch 11 assigns the voltage V3 to four of the intermediate terminals. The connection switch 11 assigns the voltage V4 to eight of the intermediate terminals.

Then, by connection switching according to the present invention, the voltage V4 is assigned to eight of the intermediate terminals T1 to T15 in the first connection state. Then, the voltage V1 is assigned to one of the remaining intermediate terminals. The voltage V2 is assigned to two of the remaining intermediate terminals. The voltage V3 is assigned to four of the remaining intermediate terminals.

In the second connection state, switching should be performed so that the voltage V4 remains to be assigned to one of the eight intermediate terminals to which the voltage V4 has been assigned in the first connection state, the voltage V1 is assigned to one of the remaining seven intermediate terminals, the voltage V2 is assigned to two of the remaining seven intermediate terminals, the voltage V3 is assigned to four of the remaining seven intermediate terminals, and the voltage V4 is assigned to all the seven intermediate terminals to which the voltages V1 to V3 have been assigned in the first connection state.

By applying the present invention as described above, influence of device variations of the operation unit can be reduced only by switching between the two connection states, and a highly accurate output circuit can be thereby implemented.

Next, a description will be given to a configuration in which the output circuit of the present invention has been applied to a data driver of a display device for liquid crystal application. FIG. 23 is a diagram showing a configuration of a data driver of a display device in an example of the present invention. Though no particular limitation is imposed, FIG. 23 shows an example in which a digital-to-analog converter circuit (DAC) 15 is formed of the connection switch 11, the operation unit 12, and the decoder 13 described in the second example. The data driver in FIG. 23 is the data driver capable of performing a 6-bit (64 gray scale) output. An output Tout of each DAC (15) is connected to a data line (indicated by reference numeral 962 in FIG. 24) of a display panel not shown.

Blocks of circuits such as a latch address selector 921 and a latch 922 are the same as those shown in FIG. 26.

A reference voltage generation circuit (16) generates four reference voltages (Vref1 to Vref4) for 64 output levels, and is shared by the DACs (15). Then, when the four reference voltages are set to first, eighth, fifty-seventh, and sixty-fourth voltages of 64-level voltages that are equally spaced, respectively, an output voltage of each DAC (15) is expressed by Expression (2), and the 64 output levels become linear.

Accordingly, with respect to the number of output voltages of the 64 levels, the number of the reference voltages is four. Area saving of the DAC can be thereby implemented.

The connection switching signal common to the DACs (15) is supplied to the connection switch 11, and the connection switch 11 assigns three voltages selected by the decoder 13 to the seven intermediate terminals of the operation unit 12.

Then, in response to the connection switching signal, each DAC (15) assumes the first connection state or the second connection state. Thus, outputs of the respective DACs are temporally averaged by periodic switching of the connection switching signal.

Alternatively, the connection switching signal does not need to be provided in common to all the DACs (15).

When the connection switching signal is supplied to odd-numbered DACs counted from the left and a complementary signal of the connection switching signal is supplied to even-numbered DACs among the DACs (15) in FIG. 23, the even-numbered DACs are brought into the second connection state when the odd-numbered DACs are in the first connection state. When the odd-numbered DACs are in the second connection state, the even-numbered DACs are brought into the first connection state. By doing so, output voltages of the respective DACs can be time averaged and can also be spatially averaged.

Each DAC in FIG. 23 may be formed of a plurality of blocks using 64 (=$2^6$) output levels as one block. In that case, in the reference voltage generation circuit 16 as well, the four reference voltages, the number of which corresponds to the number of blocks, are provided.

Referring to FIG. 23, a power supply voltage for each of the reference voltage generation circuit (gray scale voltage generation circuit) 16, decoder 13, and operation unit 12 is defined according to voltages generated by the reference voltage generation circuit 16.

On the other hand, each of the latch address selector 921 and the latch 922 can be set separately from the power supply voltage. In order to implement area saving and power saving, a power supply voltage for each of the latch address selector 921 and the latch 922 may be set to the power supply voltage lower than the power supply voltage for each of the reference (gray scale) voltage generation circuit 16, decoder 13, and operation unit 12. When this arrangement is made, a level shift circuit (not shown) is provided for level conversion. When the level shift circuit is applied to the present invention, a level shift circuit (not shown) may be preferably provided between the latch 922 and the decoders 13.

FIG. 24 shows an example when the present invention has been applied to a display device. Referring to FIG. 24, a data driver 980 is the data driver of the configuration in FIG. 23, and is set to receive 12-bit data and output 4096 linear outputs.

When a linear output data driver is employed, by assigning gray scale voltages that conform to a gamma characteristic of a display device (using a liquid crystal, an organic EL element, or the like) from among a great number of linear output levels, the gray scale voltages that conform to the gamma characteristic of the display device can be output. For this reason, the data driver includes the number of linear gray scales larger than the number of gray scales for display.

The example shown in FIG. 24 includes a data conversion table 991 for converting L-bit data corresponding to gray scales for display into 12-bit data ($L<12$) corresponding to linear gray scales, and a data conversion circuit 990 that performs data conversion by referring to the data conversion table 991.

As the data conversion table 991, the table associated with a gamma curve of the liquid crystal and characteristics for each of the colors of R, G, B of the liquid crystal and the organic EL (Electroluminescence) is suitable.

The data conversion table 991 and the data conversion circuit 990 should be configured so that 12-bit data is supplied to the data driver 980 therefrom. It is simple and easy to provide the data conversion table 991 and the data conversion circuit 990 so that the data conversion table 991 and the data conversion circuit 990 are liked to a display controller 950, as shown in FIG. 24.

A switching period of the connection switching signal supplied to each connection switch 11 of the data driver in FIG. 23 can be switched using an integer multiple of a rewriting period of one screen (a frame period) of a display device or an integer multiple of a rewriting period of a data line (a line period). In this case, luminance of the display device for the same video data is averaged over the integer multiple of the rewriting period of one screen. Display quality can be thereby improved.

Switching of the connection switching signal may be performed a plurality of times within one data period in which a gray scale voltage signal is driven to a data line. In this case, if comparatively small positive and negative offsets are alternately supplied, the offsets are alleviated within the data line and are averaged because the data line is a large capacitive load. With this arrangement, display quality can also be improved.

As described above, when the present invention is applied to the display device, an output voltage of each DAC in FIG. 23 or a driving voltage of the display device is temporally averaged. Thus, image display unevenness caused by device variations of the operation unit 12 within the DAC can be reduced. As a result, high-quality image display can be realized.

By applying the DAC according to the present invention to any of such data drivers of display devices including display devices in accordance with other method, cost reduction and frame formation of the display devices can be promoted, and at the same time, high-quality image display can be obtained.

The output circuit according to the present invention can be of course applied also to a display device such as an organic EL display of an active matrix driving system that performs display by outputting a voltage signal of multi-valued levels to a data line, for example, like a liquid crystal display device.

Though FIG. 24 shows an example in which the linear output data driver is used, 12-bit video data may be input and 12-bit output voltage may be obtained without using the data conversion circuit 990. In this case, the output voltages of the reference voltage generation circuit 16 should be set so that the output voltages conform to the gamma characteristic of the display device.

The DACs explained in the examples described above are each formed of MOS transistors. In a driving circuit of a liquid crystal display device, each of the DACs may be formed of MOS transistors (TFT's) made of polycrystal silicon. Though the examples described above showed examples where the DACs described in the examples were applied to an integrated circuit, the DACs can be of course applied to a discrete device configuration as well.

The above description was given in connection with the examples. The present invention, however, is not limited to the examples described above, and of course includes various variations and modifications that could be made within the scope of respective claims of the present invention of this application.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. An output circuit comprising:

a connection switch that includes first to third terminals for receiving first to third voltages, respectively, and first to seventh intermediate terminals, and that selects and supplies the first voltage, the second voltage, or the third voltage to each of said first to seventh intermediate terminals including selection of the same voltage for a plurality of the intermediate terminals, said connection switch switching assignment of the first to third voltages to said first to seventh intermediate terminals responsive to a connection switching signal; and an operation unit that receives the voltages supplied to said first to seventh intermediate terminals, and outputs to an output terminal of said output circuit a voltage obtained by performing a predetermined operation on the voltages supplied to said first to seventh intermediate terminals.

2. The output circuit according to claim 1, wherein said connection switch performs switching between a first connection state and a second connection state responsive to the connection switching signal; wherein in the first connection state, said connection switch outputs the first voltage to said first intermediate terminal, outputs the second voltage to said second and third intermediate terminals, and outputs the third voltage to said fourth through seventh intermediate terminals; and in the second connection state, said connection switch outputs the third voltage to said first through fourth intermediate terminals, outputs the second voltage to said fifth and sixth intermediate terminals, and outputs the first voltage to said seventh intermediate terminal; and wherein said operation unit outputs to said output terminal an average voltage of the voltages supplied to said first to seventh intermediate terminals.

3. The output circuit according to claim 2, wherein said connection switch includes:

a first switch connected between a first terminal with the first voltage applied thereto and said first intermediate terminal;

a second switch connected between a second terminal with the second voltage applied thereto and said second intermediate terminal;

a third switch connected between the second terminal and said third intermediate terminal;

a fourth switch connected between said third terminal with the third voltage applied thereto, and said fifth intermediate terminal;

a fifth switch connected between said third terminal and said sixth intermediate terminal;

a sixth switch connected between said third terminal and said seventh intermediate terminal;

said first to sixth switches being on/off controlled by the connection switching signal;

a seventh switch connected between said first terminal and said seventh intermediate terminal;

an eighth switch connected between said second terminal and said fifth intermediate terminal;

a ninth switch connected between said second terminal and said sixth intermediate terminal;

a tenth switch connected between said third terminal and said first intermediate terminal;

an eleventh switch connected between said third terminal and said second intermediate terminal; and a twelfth switch connected between said third terminal and said third intermediate terminal;

said seventh to twelfth switches being on/off controlled by a complementary signal of the connection switching signal;

said third terminal being connected to said fourth intermediate terminal, and the third voltage being output to said fourth intermediate terminal irrespective of a state of the connection switching signal.

4. The output circuit according to claim 1, wherein said operation unit comprises a differential amplifier and a polarity switch; wherein said differential amplifier includes:

first to seventh differential pairs;

first to seventh current sources that supply currents to said first to seventh differential pairs, respectively;

a load circuit connected in common to output pairs of said first to seventh differential pairs;

first outputs of output pairs of said first to seventh differential pairs being connected in common to a first connection node; and second outputs of output pairs of said first to seventh differential pairs being connected in common to a second connection node;

an amplification stage having an output terminal thereof connected to said output terminal of said output circuit; and a switching circuit that connects said first connection node or said second connection node to an input terminal of said amplification stage responsive to a predetermined control signal; and wherein said polarity switch performs switching between a first connection state and a second connection state responsive to the control signal; wherein in the first connection state, said first to seventh intermediate terminals of said connection switch are connected to first inputs of respective input pairs of said first to seventh differential pairs, respectively, and said output terminal of said differential amplifier is connected to second inputs of said respective input pairs of said first to seventh differential pairs; and in the second connection state, said output terminal of said differential amplifier is connected to the first inputs of said respective input pairs of said first to seventh differential pairs, and said first to seventh intermediate terminals of said connection switch are connected to the second inputs of said respective input pairs of said first to seventh differential pairs, respectively.

5. The output circuit according to claim 4, wherein in said differential amplifier, sizes of transistors forming said first to seventh differential pairs are set to be equal to one another; and current values of said first to seventh current sources are set to be equal to one another.

6. An output circuit comprising:

a connection switch that includes first through Mth terminals for receiving first through Mth voltages (V1, V2, . . . , VM), respectively, and first to $(2^M-1)$th intermediate terminals, and that supplies the voltage Vi (where i is an integer greater than or equal to 1 and less than or equal to M) to $2^{(i-1)}$ of the first to $(2^M-1)$th intermediate terminals, said connection switch switching assignment of the first through Mth voltages to said first to $(2^M-1)$th intermediate terminals; and an operation unit that receives the voltages supplied to the first to $(2^M-1)$th intermediate terminals and outputs to an output terminal of said output circuit an average voltage of the voltages supplied to the first to $(2^M-1)$th intermediate terminals.

7. The output circuit according to claim 6, wherein said operation unit comprises a differential amplifier and a polarity switch; wherein said differential amplifier includes:

first to $(2^M-1)$th differential pairs;

first to $(2^M-1)$th current sources that supply currents to said first to $(2^M-1)$th differential pairs, respectively;

a load circuit connected in common to output pairs of said first to $(2^M-1)$th differential pairs;

first outputs of output pairs of said first to $(2^M-1)$th differential pairs being connected in common to a first connection node; and second outputs of output pairs of said first to $(2^M-1)$th differential pairs being connected in common to a second connection node;

an amplification stage having an output terminal connected to said output terminal of said output circuit; and a switching circuit that connects a first connection node or a second connection node to an input terminal of said amplification stage responsive to a predetermined control signal; and wherein said polarity switch performs switching between a first connection state and a second connection state, wherein in the first connection state, said first to $(2^M-1)$th intermediate terminals of said connection switch are connected to first inputs of respective input pairs of said first to $(2^M-1)$th differential pairs, respectively, and said output terminal of said differential amplifier is connected to second inputs of said respective input pairs of said first to $(2^M-1)$th differential pairs; and in the second connection state, said output terminal of said differential amplifier being connected to the first inputs of said respective input pairs of said first to $(2^M-1)$th differential pairs and said first to $(2^M-1)$th intermediate terminals of said connection switch being connected to the second inputs of said respective input pairs of said first to $(2^M-1)$th differential pairs, respectively.

8. The output circuit according to claim 6, wherein said connection switch performs switching between a first connection state and a second connection state; wherein in the first connection state, the voltage VM is assigned to $2^{M-1}$ of said first to $(2^M-1)$ intermediate terminals, the voltage V1 is assigned to one of a remainder of said first to $(2^M-1)$ intermediate terminals, the voltage V2 is assigned to two of the remainder of said first to $(2^M-1)$ intermediate terminals, the voltage V3 is assigned to four of the remainder of said first to $(2^M-1)$ intermediate terminals, and the voltage V(M−1) is assigned to $2^{(M-2)}$ of the remainder of said first to $(2^M-1)$ intermediate terminals; wherein the voltage Vi (where i is an integer greater than or equal to 1 and less than or equal to M−1) is assigned to $2^{(i-1)}$ of the remainder of the first to $(2^M-1)$ intermediate terminals; and in the second connection state, the voltage VM remains to be assigned to one of said $(2^M-1)$ intermediate terminals with the voltage VM assigned thereto in the first connection state, the voltage V1 is assigned to one of remaining $(2^{(M-1)}-1)$ intermediate terminals, the voltage V2 is assigned to two of the remaining $(2^{(M-1)}-1)$ intermediate terminals, the voltage V3 is assigned to four of the remaining $(2^{(M-1)}-1)$ intermediate terminals, the voltage V(M−1) is assigned to $2^{(M-2)}$ of the remaining $(2^{(M-1)}-1)$ intermediate terminals; wherein the voltage Vi (where i is an integer greater than or equal to 1 and less than or equal to M−1) is assigned to $2^{(i-1)}$ of the remainder of the first to $(2^M-1)$ intermediate terminals; and the voltage VM is assigned to entirety of $(2^{(M-1)}-1)$ intermediate terminals to which the voltages V1 to V(M−1) are assigned in the first connection state.

9. A digital-to-analog converter comprising:

a selection circuit that selects M (M being an integer greater than or equal to two) voltages (V1, V2, . . . , and VM) inclusive of the voltages that may be identical from among $2^K$ (K being an integer greater than or equal to one) reference voltages; and the output circuit as set forth in claim 6; wherein the output circuit receives the M voltages (V1, V2, . . . , and VM) from said selection circuit at first through Mth terminals thereof;

the $2^K$ (where K is an integer greater than or equal to one) reference voltages being set to $(1+(2^M-1)\Sigma i=_1{}^K(\alpha_i \times 2^{(i-1)M})$th ($\alpha_1$ to $\alpha_K$ assuming one of values of zero and one) reference voltages among equally spaced voltages of $2^{KM}$ levels, and $2^{KM}$ equally spaced output voltages being obtained.

* * * * *